(12) United States Patent
Schultz et al.

(10) Patent No.: US 6,859,515 B2
(45) Date of Patent: Feb. 22, 2005

(54) ILLUMINATION SYSTEM, PARTICULARLY FOR EUV LITHOGRAPHY

(75) Inventors: Jörg Schultz, Aalen (DE); Johannes Wangler, Königsbronn (DE)

(73) Assignee: Carl-Zeiss-Stiftung Trading (DE)

( * ) Notice: Subject to any disclaimer, the term of this patent is extended or adjusted under 35 U.S.C. 154(b) by 339 days.

(21) Appl. No.: 10/090,470

(22) Filed: Mar. 4, 2002

(65) Prior Publication Data

US 2003/0012333 A1 Jan. 16, 2003

Related U.S. Application Data

(63) Continuation-in-part of application No. 09/705,662, filed on Nov. 3, 2000, now Pat. No. 6,400,794.
(60) Provisional application No. PCT/EP99/02999, filed on May 4, 1999.

(30) Foreign Application Priority Data

| May 5, 1998 | (DE) | ............................................ 198 19 898 |
| Feb. 2, 1999 | (DE) | ............................................ 199 03 807 |
| Feb. 8, 1999 | (DE) | ..................................... 299 02 108 U |
| May 4, 1999 | (WO) | ............................... PCT/EP99/02999 |

(51) Int. Cl.$^7$ .............................................. G21K 5/04
(52) U.S. Cl. ..................... 378/34; 378/145; 378/146; 378/147; 378/154
(58) Field of Search ........................ 378/34, 145, 146, 378/147, 154

(56) References Cited

U.S. PATENT DOCUMENTS

| 4,195,913 A | 4/1980 | Dourte et al. ................ 350/292 |
| 4,294,538 A | 10/1981 | Ban ............................ 355/51 |
| 4,389,115 A | 6/1983 | Richter ......................... 355/26 |
| 4,651,012 A | 3/1987 | Clark et al. .............. 250/505.1 |
| 4,740,276 A | 4/1988 | Marmo et al. ................. 204/7 |
| 5,148,442 A | 9/1992 | O'Neil et al. ................. 372/71 |
| 5,222,112 A | 6/1993 | Terasawa et al. ............. 378/34 |
| 5,339,346 A | 8/1994 | White ........................... 378/34 |
| 5,361,292 A | 11/1994 | Sweatt ......................... 378/34 |
| 5,402,267 A | 3/1995 | Fürter et al. ................ 359/727 |
| 5,439,781 A | 8/1995 | MacDowell et al. ......... 460/311 |
| 5,440,423 A | 8/1995 | Ogura ......................... 359/365 |
| 5,512,759 A | 4/1996 | Sweatt ..................... 250/492.1 |
| 5,581,605 A | 12/1996 | Murakami et al. ............ 378/84 |
| 5,647,664 A | 7/1997 | Hanečka ..................... 362/308 |

(List continued on next page.)

FOREIGN PATENT DOCUMENTS

| EP | 0066295 A1 | 12/1982 |
| EP | 0359018 A2 | 3/1990 |
| EP | 0939341 A2 | 9/1999 |
| EP | 1026547 A2 | 8/2000 |

OTHER PUBLICATIONS

Murphy et al., "Synchrotron Radiation Sources and Condensers for Projection X–Ray Lithography", APPLIED OPTICS, vol. 32, No. 34, pp. 6920–6929 (Dec. 1, 1993).
"Handbook on Synchrotron Radiation", Ernst–Echard Koch ed., pp. 140–145, 1098–1111 (1983).

Primary Examiner—David V. Bruce
Assistant Examiner—Therese Barber
(74) Attorney, Agent, or Firm—Ohlandt, Greeley, Ruggiero & Perle, LLP

(57) ABSTRACT

There is provided an illumination system for light having wavelengths $\leq 193$ nm. The system includes (a) a first raster element for receiving a first diverging portion of the light and directing a first beam of the light, (b) a second raster element for receiving a second diverging portion of the light and directing a second beam of the light, where the first raster element is oriented at an angle with respect to the second raster element to cause a center ray of the first beam to intersect with a center ray of the second beam at an image plane, and (c) an optical element for imaging secondary sources of the light in an exit pupil, where the optical element is situated in a path of the light after the first and second raster elements and before the image plane.

29 Claims, 37 Drawing Sheets

U.S. PATENT DOCUMENTS

| | | | |
|---|---|---|---|
| 5,669,708 A | 9/1997 | Mashima et al. | 362/341 |
| 5,677,939 A | 10/1997 | Oshino | 378/34 |
| 5,737,137 A | 4/1998 | Cohen et al. | 359/859 |
| 5,755,503 A | 5/1998 | Chen et al. | 353/38 |
| 5,896,438 A | 4/1999 | Miyake et al. | 378/34 |
| 5,993,010 A | 11/1999 | Ohzawa et al. | 353/99 |
| 5,995,582 A | 11/1999 | Terashima et al. | 378/34 |
| 6,570,168 B1 * | 5/2003 | Schultz et al. | 250/492.2 |

* cited by examiner diameter_field
diameter_pupil
NA_ret diameter_field
diameter_pupil
NA_ret illumination system with planar facetted mirror illumination system with planar facetted mirror illumination system with planar facetted mirror illumination system with planar facetted mirror facetted mirror in a convegent beam path facetted mirror in a convegent beam path illumination system with facetted collector mirror illumination system with facetted collector mirror illumination system with facetted collector mirror

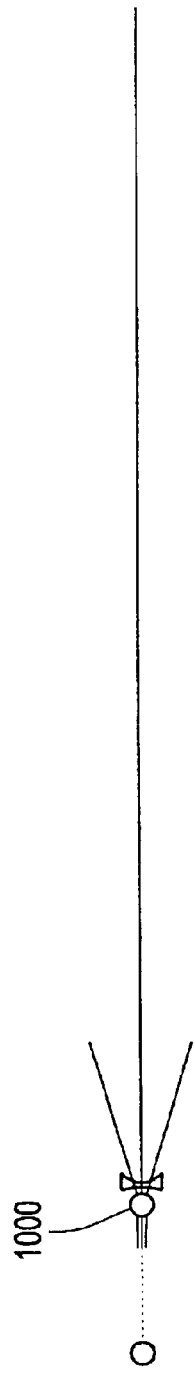
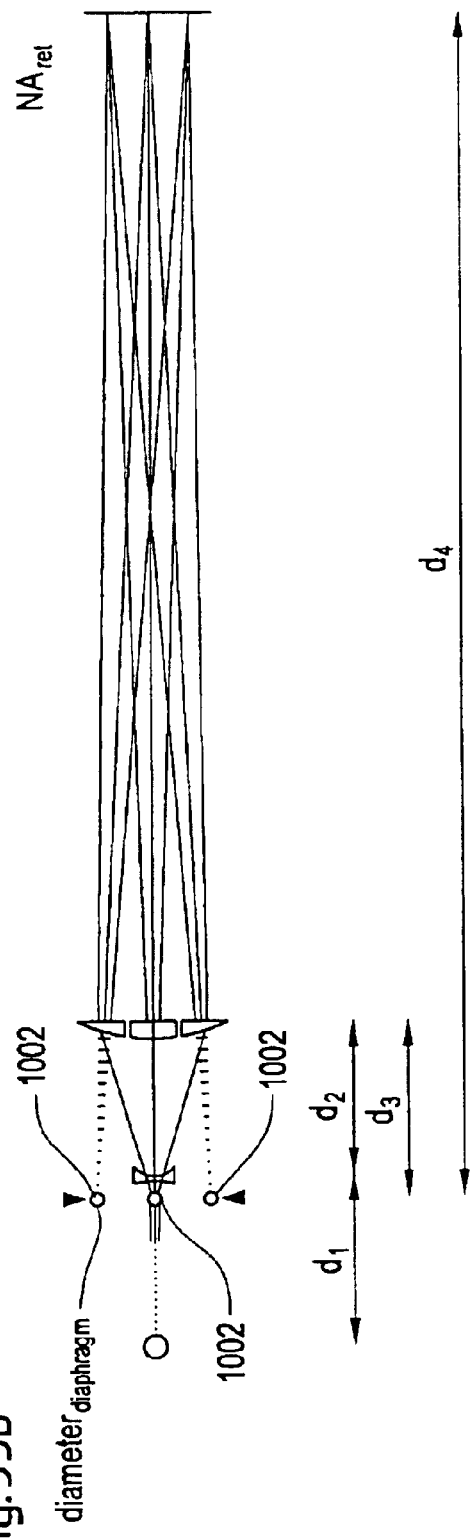
Fig.55a
Fig.55b

ILLUMINATION SYSTEM, PARTICULARLY FOR EUV LITHOGRAPHY

CROSS-REFERENCE TO RELATED APPLICATIONS

The present application is a continuation-in-part of U.S. patent application Ser. No. 09/705,662, which was filed on Nov. 3, 2000 now U.S. Pat. No. 6,400,794, and which claimed priorities of: (a) International Application No. PCT/EP99/02999, filed May 4, 1999; (b) German Patent Application No. DE 199 03 807.4, filed Feb. 2, 1999; (c) German Patent Application No. DE 299 02 108.4, filed Feb. 8, 1999; and (d) German Patent Application No. DE 198 19 898.1, filed May 5, 1998.

BACKGROUND OF THE INVENTION

The invention concerns an illumination system for wavelength $\leq 193$ nm, particularly for extreme ultraviolet (EUV) lithography, as well as a projection exposure apparatus with such an illumination system and a process for the production of microelectronic components with such a projection exposure apparatus.

In order to reduce the structural widths for electronic components, particularly in the submicron range, it is necessary to reduce the wavelength of the light utilized for microlithography. Lithography with soft x-rays, so-called EUV lithography, is conceivable at wavelengths below 193 nm, for example.

An illumination system suitable for EUV lithography will homogeneously, i.e., uniformly illuminate, with as few reflections as possible, a predetermined field for EUV lithography, particularly the annular field of an objective. Furthermore, the pupil of the objective should be illuminated up to a specific degree of filling, independent of the field, and the exit pupil of the illumination system should lie in the entrance pupil of the objective.

An illumination system for a lithography device, which uses EUV radiation, has been made known from U.S. Pat. No. 5,339,246. For uniform illumination in the reticle plane and filling of the pupil, U.S. Pat. No. 5,339,246 proposes a condenser, which is constructed as a collector lens, and comprises at least four pairs of mirror facets, which are arranged symmetrically. A plasma light source is used as the light source.

An illumination system with a plasma light source comprising a condenser mirror is shown in U.S. Pat. No. 5,737,137, in which an illumination of a mask or a reticle to be illuminated is achieved by means of spherical mirrors.

U.S. Pat. No. 5,361,292 shows an illumination system, in which a plasma light source is provided and the point plasma light source is imaged by means of a condenser, which has at least three aspherical mirrors arranged off-center, in a ring-shaped illuminated surface.

An illumination system has been made known from U.S. Pat. No. 5,581,605, in which a photon beam is spilt into a multiple number of secondary light sources by means of a plate with raster elements. A homogeneous or uniform illumination is achieved in this way in the reticle plane. The imaging of the reticle on the wafer to be exposed is produced by means of a conventional reducing optics. A gridded mirror with equally curved elements is provided precisely in the illuminating beam path.

U.S. Pat. No. 5,677,939 shows an illumination system for EUV illumination devices, in which an annular field is homogeneously illuminated. In the EUV illumination system according to U.S. Pat. No. 5,677,939, the beams emitted from the EUV source are formed into a parallel beam of light, for example, by means of a mirror. In order to form a multiple number of secondary light sources, the parallel beam of light is guided onto a mirror with a plurality of cylinder raster elements. U.S. Pat. No. 5,677,939 also describes the use of synchrotron radiation sources, but of course, the light of the source is guided directly onto the mirror with cylinder raster elements, due to the parallel nature of the emitted synchrotron radiation, without optical elements situated therebetween. All embodiments shown in U.S. Pat. No. 5,677,939 operate in a parallel beam path. In addition, the facetted mirrors known from U.S. Pat. No. 5,677,939 contain facets with an optical effect and are arranged on a planar substrate.

From U.S. Pat. No. 5,512,759 for an arc shaped-field projection system with a synchrotron radiation source an illumination system has been made known, which comprises a condenser system with a multiple number of convergent mirrors. The mirrors collect the radiation emitted by the synchrotron radiation source, to form an annular light beam, which corresponds to the annular field to be illuminated. Therefore, the annular field is illuminated very uniformly. The synchrotron radiation source has a beam divergence >100 mrads in the beam plane.

U.S. Pat. No. 5,439,781 shows an illumination system with a synchrotron radiation source, in which the waveguide value, i.e., the Lagrange optical invariant, is adjusted by means of a scatter disk in the entrance pupil of the objective, whereby the scatter disk may have a plurality of pyramidal structures. The synchrotron radiation source in the case of U.S. Pat. No. 5,439,781 also has a beam divergence >100 mrads. The collector mirror for collecting the synchrotron radiation and bundling the same may itself be constructed with facets.

The disclosure content of all of the previously named documents:

U.S. Pat. No. 5,339,246
U.S. Pat. No. 5,737,137
U.S. Pat. No. 5,361,292
U.S. Pat. No. 5,581,605
U.S. Pat. No. 5,677,939
U.S. Pat. No. 5,512,759
U.S. Pat. No. 5,439,781 is incorporated in the present application by reference.

SUMMARY OF THE INVENTION

An object of the invention is to provide an illumination system that is constructed as simply as possible fulfilling the requirements for an exposure system for wavelengths $\leq 193$ nm, particularly in the EUV region. In addition to a uniform illumination of the reticle, also the telecentricity requirements of a system for wavelengths $\leq 193$ nm particularly should be fulfilled.

Telecentricity is to be understood in the present application in that the entire system is telecentric at the wafer. This requires an adaptation of the exit pupil of the illumination system to the entrance pupil of the objective, which is finite for a reflective reticle.

In the present application, the telecentricity requirement is fulfilled, if the divergence of the principal rays of the illumination system and objective in the reticle plane does not exceed a predetermined value, for example, $\pm 4.0$ mrads, preferably $\pm 1.0$ mrad, and the principal rays impinge on the wafer telecentrically.

One embodiment of the present invention is an illumination system for light having wavelengths ≦193 nm. The system includes (a) a first raster element for receiving a first diverging portion of the light and directing a first beam of the light, (b) a second raster element for receiving a second diverging portion of the light and directing a second beam of the light, where the first raster element is oriented at an angle with respect to the second raster element to cause a center ray of the first beam to converge, i.e., intersect, with a center ray of the second beam at an image plane, and (c) an optical element for imaging secondary sources of the light in an exit pupil, where the optical element is situated in a path of the light after the first and second raster elements and before the image plane. To facilitate an alignment of the beams for convergence in the image plane, one or more of the raster elements can be made movable so that the angle of orientation can be altered.

Another embodiment of the present invention is an illumination system for wavelengths ≦193 nm comprising at least a device for producing secondary light sources that includes at least a first mirror, which is divided into raster elements, and one or more optical elements, which are arranged between the device and an image plane of the illumination system, wherein the optical elements image the secondary light sources in an exit pupil of the illumination system. The raster elements of the illumination system according to the invention are tilted to have a converging effect to a diverging light beam impinging onto the first mirror. By tilting the raster elements to have a converging effect to a diverging light beam, the structural length of an illumination system can be reduced and therefore such systems are advantageously compact.

Typical EUV radiation sources are laser produced plasma sources, pinch plasma sources and synchrotron radiation sources. Synchrotron radiation sources are used in the EUV region as preferred light sources, with a beam divergence smaller than 5 mrads in the plane perpendicular to a predetermined plane. Synchrotron radiation is emitted, if relativistic electrons are deflected in a magnetic field. The synchrotron radiation is emitted tangentially to the path of the electrons.

At the present time, one can distinguish three types of sources in the case of synchrotron radiation sources:
(i) bending magnets
(ii) wigglers
(iii) undulators.

With suitable dimensioning all above-mentioned synchrotron EUV radiation sources, provide EUV radiation, for example, of 13 or 11 nm with sufficient power for EUV lithography.

Since the synchrotron radiation sources are characterized by a beam divergence that is smaller than 5 mrads, at least in one plane, advantageously the system comprises means for broadening the beam, for example, a collector system.

In an advantageous embodiment, diverging mirrors or scanning mirrors, which are moved for illuminating a surface can be provided as means for broadening a beam.

Since field and aperture of the light source are insufficient for filling or illuminating field and aperture in the reticle plane, the illumination system according to the invention contains at least one mirror with raster elements for producing a plurality of secondary light sources, which are distributed uniformly in the diaphragm plane. Since the geometric dimensions of the raster elements of the first mirror determines the form of the illuminated field in the reticle plane, field raster elements are formed preferably in a rectangular shape in the case of an arc-shaped scanning slit. The raster elements of the first mirror, which are also designated as field raster elements, are designed in such a way that their optical effect is to form images of the light source in the diaphragm plane, so-called secondary light sources. If the extension of the light source is small, for example, approximately point-like, as in the case of an undulator source, then the extension of each of the secondary light sources is also small, and all light rays approximately pass through one point. In each plane after the diaphragm plane then an image of the field raster elements is formed, whereby the magnification is given by the ratio of the distance diaphragm-reticle to the distance field raster element-diaphragm. The raster elements are tilted in such a way that the images of the field raster elements are superimposed at least partially in the reticle plane.

The secondary light sources are advantageously imaged into the entrance pupil of the objective with a first optical element, e.g., a field mirror or a field lens, that forms an arc-shaped field.

In the case of extended light sources, as, for example in case of a bending magnet, the secondary light sources are extended; therefore the images of the field raster elements in the reticle plane are not sharp. A sharp image can be achieved in such a system, if one provides a second mirror or lens with raster elements, i.e., a so-called double facetting, wherein the raster elements of the second mirror or lens, the so-called pupil raster elements, are located on, or nearby, the site of the secondary light sources.

In systems with two mirrors with raster elements, the form of the raster elements of the second mirror, i.e., the pupil raster elements, is adapted to the shape of the secondary light sources and thus differs from the form of the first raster elements, i.e., the field raster elements. It is particularly preferred if the pupil raster elements are round, if the light source is also round in shape.

It is particularly preferred that the first mirror with raster elements is illuminated in a round manner or rotation-symmetrically, since then a uniform distribution of the secondary light sources in the diaphragm plane can be achieved with an appropriate distribution.

If the illumination of the first mirror is not round, but, for example, rectangular, then the desired round illumination of the entrance pupil of the objective is achieved by double facetting such a system.

The first optical elements situated after the mirrors with raster elements serve for imaging the diaphragm plane of the illumination system in the entrance pupil of the projection objective and to form the arc-shaped field. Further, they serve for forming the illumination distribution according to the requirements of the exposure process.

It is particularly preferred, that the optical elements comprise grazing-incidence mirrors with an angle of incidence <20°. In order to minimize the light losses associated with each reflection, it is advantageous if the number of field mirrors its kept small. Embodiments with at most two field mirrors are particularly preferred.

A numerical example will be given below, from which it is obvious that increasing the waveguide value, i.e. the Lagrange optical invariant, for example, in the case of an undulator source is necessary.

If one requires an aperture in the wafer plane of $NA_{wafer}$= 0.1–0.25, then this means an aperture in the reticle plane of $NA_{reticle}$=0.025–0.0625 in the case of 4:1 systems. If the illumination system will illuminate this aperture homogeneously and independently of the field up to a filling degree of σ=0.6, then the EUV source must make available the following 2-dim waveguide value (LLW), i.e., the Lagrange optical invariant or etendu.

$$LLW_{illumination} = \sigma^2 LLW_{obj} = 0.149 \text{ mm}^2 - 0.928 \text{ mm}^2.$$

The waveguide value LLW, i.e., the Lagrange optical invariant, is defined generally as follows:

$LLW = x \cdot y \cdot NA^2 + A \cdot NA^2$, whereby A is the illuminated surface. In the reticle plane, A amounts to, e.g., 110 mm×6 mm.

An undulator source will be considered as a light source for the EUV illumination system according to the invention, in a first form of embodiment.

The waveguide value, i.e., the Lagrange optical invariant or etendu, for the undulator source, can be estimated according to a simplified model, assuming a homogeneous surface radiator with diameter $\emptyset = 1.0$ mm and aperture $NA_{undulator} = 0.001$ with
$LLW = A \cdot NA^2$
$A_{undulator} = \pi \cdot (\cancel{c}/2)^2 = 0.785 \text{ mm}^2$
$NA_{undulator} = 0.001$ so that $LLW_{undulator} = A \cdot NA^2 = 0.00000079 \text{ mm}^2 = 7.9e\text{-}07 \text{ mm}^2$.

As can be seen from this rough estimation, the waveguide value of the undulator source is disappearingly small in comparison to the required waveguide value.

The waveguide value, i.e., the Lagrange optical invariant, can be increased by providing distributed secondary light sources to the necessary amount in the entrance pupil of the objective. For this purpose, the first mirror is designed with raster elements. The illumination of the entrance pupil of an objective is defined by the filling factor. The following applies:

$$\text{Filling factor: } \sigma = \frac{r_{illumination}}{R_{objective\ aperture}}$$

wherein $R_{objective\ aperture}$ is the radius of the entrance pupil of the objective, and $r_{illumination}$ is the radius of the illuminated area in the entrance pupil of the objective.

With $\sigma=1.0$, the entrance pupil is completely filled; $\sigma=0.6$ corresponds to an underfilling.

Since the partial pupils, i.e., the images of the secondary light sources in the entrance pupil of the objective, have sharp intensity peaks due to the small waveguide value of the undulator source, it is advantageous if these are smeared by means of "wobbling" field mirrors, whereby the field illumination should remain unaffected. Thus, it is advantageous to introduce a wobbling field mirror as close as possible to the reticle plane.

An estimation for the angular region to be varied by the wobbling field mirror or by the periodically moving field mirror will be given below. If one assumes for the numerical aperture in the reticle plane $NA_{ret}=0.025$ and the angular distance $\Delta NA$ of the partial pupils amounts to approximately 0.005, due to the parceling, then the angular region to be varied should lie in the order of magnitude of approximately ±2.5 mrads. An example of a wobbling field mirror would be a toroidal mirror with a size of 160×170 mm as well as a local dynamic gradient of ±2 mrads in the x and y directions with a stability of ±0.1 mrad.

A smearing can be achieved not only by means of movable so-called wobbling field mirrors, but also by dynamic deformation of the mirror surface.

In order to achieve a high scanning uniformity, the use of active lenses or mirrors for the optical elements can be advantageous.

Since the manufacture of field raster elements with a high aspect ratio of 20:1, for example, is difficult, in order to reduce the aspect ratio of field raster elements, it can be of advantage that these raster elements are of astigmatic shape. The secondary light sources are thus broken down into tangential and sagittal secondary sources, which lie in the tangential and sagittal diaphragm planes.

Whereas the system for wavelengths in the EUV region, as described above, is designed purely reflectively, i.e., exclusively with mirror components, a use is also conceivable for 193-nm or 157-nm systems. In such a case, refractive components such as lenses are used.

The systems described herein are particularly of interest for 193-nm or 157-nm systems, because they use only a few optical components and the optical elements have high absorptions at these wavelengths.

BRIEF DESCRIPTION OF THE DRAWINGS

The invention will be described below for example on the basis of the drawings.

These show:

FIGS. 55A–55B: a configuration of the invention with virtual diaphragm plane.

DESCRIPTION OF THE INVENTION

It shall first be shown theoretically on the basis of FIGS. 1–20 how a system can be provided, which satisfies the requirements with respect to uniformity and telecentricity for any desired illumination distribution A in a plane with an illumination device according to the invention. The system shown is a system with field raster element and pupil raster element plates. In the art, a raster element plate is also known as a honeycomb plate.

Figure 1:
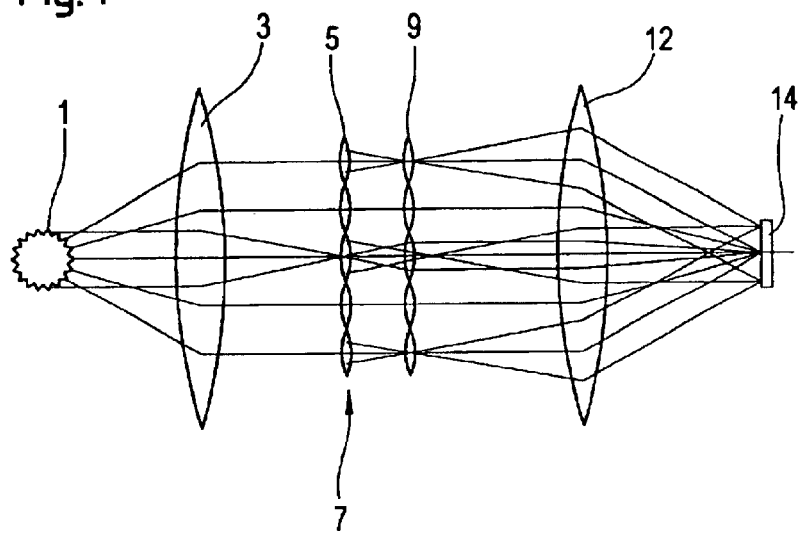
FIG. 1: principal diagram of the beam path of a system with two raster element plates.

A principal diagram of the beam path of a refractive system with two raster element plates is illustrated in FIG. 1. The light from source 1 is collected by a collector lens 3 and transformed into a parallel or convergent light beam. Field raster elements 5 of the first raster element plate 7 decompose the light pencil and produce secondary light sources at the site of pupil raster elements 9. The field lens 12 images these secondary light sources in the exit pupil of the illumination system or the entrance pupil of the subsequent objective. Such an arrangement is characterized by an interlinked beam path of the field and pupil planes from the source up to the entrance pupil of the objective. For this the designation "Köhler illumination" is often selected, as defined, for example, in U.S. Pat. No. 5,677,939, whose disclosure is incorporated to the full extent in the present application by reference.

The illumination system according to FIG. 1 will be considered segmentally below. Since the intersection of the light intensity and aperture distribution lies in the plane of the field raster elements, the system can be evaluated independently of the type of source and the collector mirror.

Figure 2A:
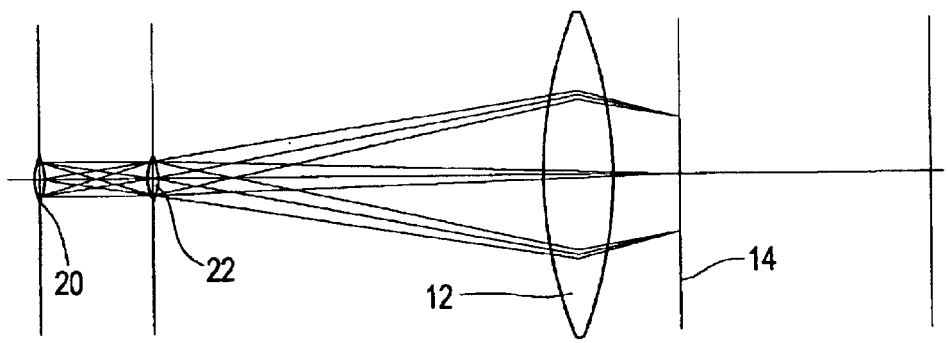
FIGS. 2A–2B: Imaging of field and pupil for the central pairs of raster elements.
Figure 2B:
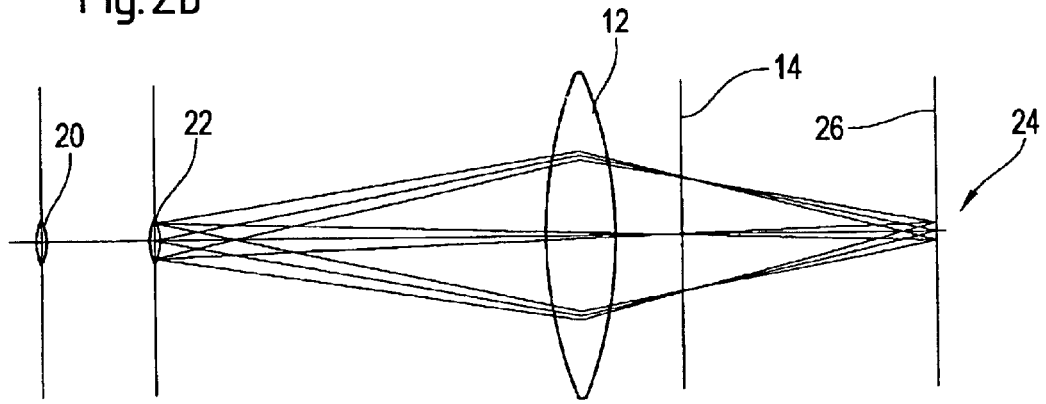

The field and pupil imaging for the central pair of raster elements 20, 22 is shown in FIGS. 2A and 2B. The field raster element 20 is imaged on reticle 14 or the mask to be imaged by means of pupil raster element 22 and field lens 12. The geometric extension of field raster element 20 determines the shape of the illuminated field in reticle plane 14. The image scale is approximately given by the ratio of the distance between pupil raster element 22 and reticle 14 and the distance between field raster element 20 and pupil raster element 22. The optical effect of field raster element 20 is to form an image of light source 1, a secondary light source, at the site of pupil raster element 22. If the extension of the light source is small, for example, approximately point-like, then all light rays run through the centers of the pupil raster elements 22. In such a case, an illumination device can be produced, in which the pupil raster elements are dispensed with.

As shown in FIG. 2B, field lens 12 images the secondary light sources in the entrance pupil 26 of an objective 24, e.g. a catoptic, katadioptic or all-reflective projection lens. If a field lens is introduced into the beam path, then the field imaging can be influenced in such a way that the image of the field raster elements is deformed by the control of the distortion. It is possible to deform a rectangle into a segment of a ring field, which is herein also referred to as, an annular field or an arc-shaped field. The image scale of the field raster element projection is thus not changed.

Figure 3:
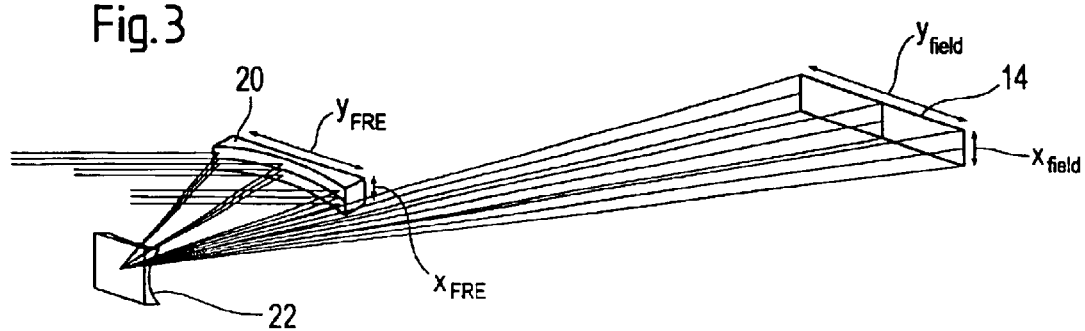
FIG. 3: path of the light beam for a rectangular field raster element in combination with a rectangular pupil raster element.

The beam path of the light rays is shown in FIG. 3 for a special geometric form of a field raster element and a pupil raster element.

Figure 4:
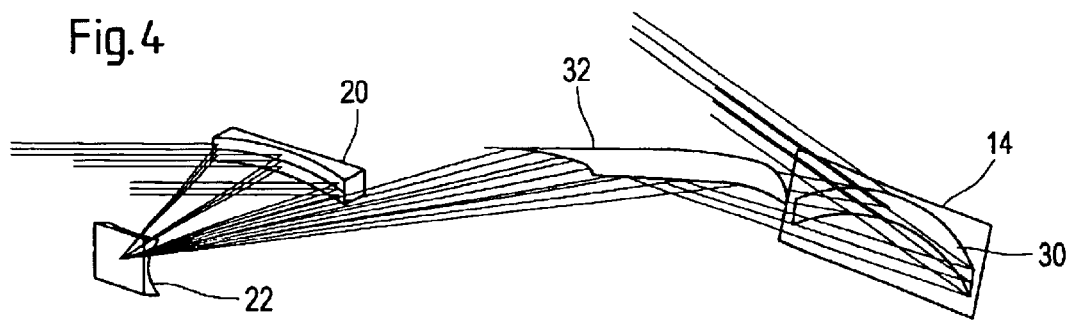
FIG. 4: Beam path according to FIG. 3 with field lens introduced in the beam path.

The shape of field raster element 20 is a rectangle in the embodiment shown in FIG. 3. The aspect ratio of field raster element 20 thus corresponds to the ratio of the arc length to the annular width of the required annular field in the reticle plane. As shown in FIG. 4, the annular field is shaped by the field lens. As shown in FIG. 3, without the field lens, a rectangular field results in the reticle plane.

In order to form annular field 30, as shown in FIG. 4, a grazing-incidence field mirror 32 is used. Under the constraint that the beam reflected by the reticle should not be directed back to the illumination system, one or two field mirrors 32 is (are) required, depending on the position of the entrance pupil of the objective.

Figure 5:
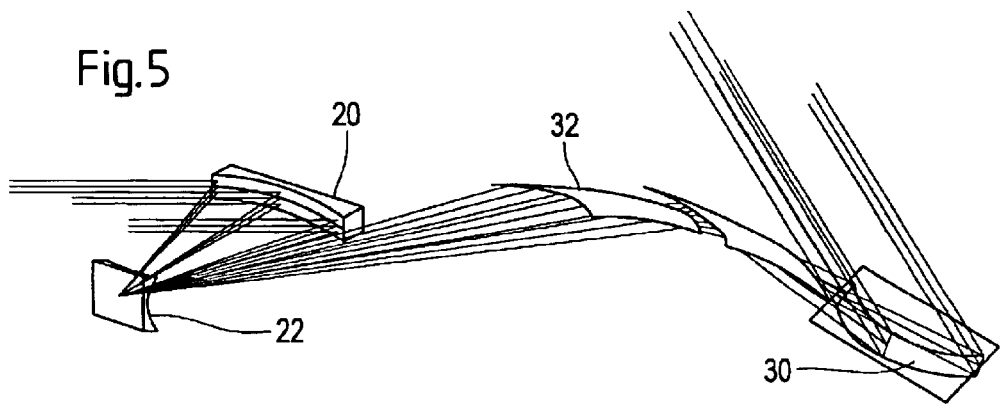
FIG. 5: Beam path according to FIG. 3 with two field lenses introduced Into the beam path.

If the principal rays run divergently into the objective that is not shown, then one field mirror 32 is sufficient, as shown in FIG. 4. In the case of principal rays entering the projection objective convergently, two field mirrors are required. The second field mirror must rotate the orientation of the ring. Such a configuration is shown in FIG. 5.

In the case of an illumination system in the EUV wavelength region, all components must be reflective ones.

The present invention is suitable for use with wavelengths in a range of about 10 nm to 15 nm. Due to the high reflection losses for $\lambda = 10$ nm–14 nm, it is advantageous that the number of reflections will be kept as small as possible.

In the construction of the reflective system, the mutual vignetting of the beams must be taken into consideration. This can occur due to construction of the system in a zigzag beam path or by operation with obscuration.

The process according to the invention for preparation of a design for an EUV illumination system with any illumination in a plane A will be described below as an example.

Figure 6:
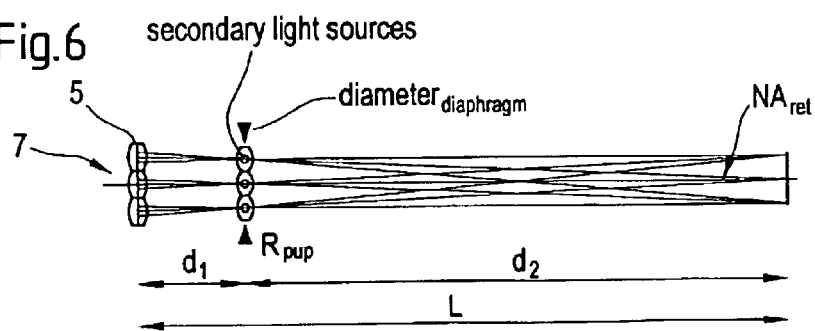
FIG. 6: principle diagram of a refractive system with field and pupil raster elements.

The definitions necessary for the process according to the invention are shown in FIG. 6.

First the beam path for the central pair of raster elements will be calculated.

In a first step, the size of the field raster elements 5 of the field raster element plate 7 will be determined. As indicated previously, the aspect ratio (x/y) results for rectangular raster elements from the form of the arc-shaped field in the reticle plane. The size of the field is determined by the illuminated area A of the intensity distribution of the arbitrary light source in the plane of the field raster elements and the number N of field raster elements on the raster element plate, which in turn is given by the number of secondary light sources. The number of secondary light sources in turn results from the uniformity of the pupil illumination as well as the intermixing.

The raster element surface $A_{FRE}$ of a field raster element can be expressed as follows with $x_{FRE}$, $y_{FRE}$:

$$A_{FRE} = x_{FRE} \cdot y_{FRE} = (x_{field}/y_{field}) \cdot y^2_{FRE}$$

whereby $x_{field} * y_{field}$ describe the magnitude of the rectangle, which establishes the annular field. Further, the following is valid for the number N of field raster elements:

$$N = A/A_{FRE} = A/[y^2_{FRE} \cdot (x_{field}/y_{field})].$$

From this, there results for the size of the individual field raster element:

$$y_{FRE} = \sqrt{A/[N \cdot (x_{field}/y_{field})]}$$

and $$x_{FRE}/y_{FRE} = x_{field}/y_{field}$$

The raster element size and the size of the rectangular field establish the imaging scale $\beta_{FRE}$ of the raster element imaging and thus the ratio of the distances $d_1$ and $d_2$.

$$\beta_{FRE} = x_{field}/y_{field-z2}/d_1$$

The pre-given structural length L for the illumination system and the raster element imaging scale $\beta_{FRE}$ determine the absolute size of $d_1$ and $d_2$ and thus the position of the pupil raster element plate. The following is valid:

$$d_1 = L/(1 + \beta_{FRE})$$

$$d_2 = d_1 \cdot \beta_{FRE}$$

Then, $d_1$ and $d_2$ determine in turn the radius of the pupil raster elements. The following is valid:

$$R_{FRE} = \frac{2 \cdot z_1 \cdot z_2}{z_1 + z_2}$$

In order to image the pupil raster elements in the entrance pupil of the objective and to remodel the rectangular field into an arc-shaped field, one or more field lenses, preferably in toroidal form, are introduced between pupil raster element and reticle. By introducing the field mirrors the previously given structural length is increased, since, among other things, the mirrors must maintain minimum distances in order to avoid vignetting.

The positioning of the field raster elements depends on the intensity distribution in the plane of the field raster elements. The number N of field raster elements pre-given by the number of secondary light sources. The field raster elements are preferably arranged on the field raster element plate in such a way, that they cover the illuminated surface, without mutually vignetting.

In order to position the pupil raster elements, the raster pattern of the secondary light sources in the entrance pupil of the objective is given in advance. The secondary light sources are imaged counter to the light direction by the field lens. The aperture stop plane of this projection is in the reticle plane. The images of the secondary light sources give the (x, y, z) position of the pupil raster elements. The tilt and rotation angles remain as degrees of freedom for producing the light path between field and pupil raster elements.

If a pupil raster element is assigned to each field raster element in one configuration of the invention, then a light path is produced by tilting and rotating field and pupil raster elements. Thereby the light beams are deviated in such a way that the center rays all intersect the optical axis and reticle plane.

The assignment of field and pupil raster elements can be made freely. One possibility for arrangement would be to assign spatially adjacent raster elements to one another. Thereby the deflection angles will be minimal. Another possibility consists of homogenizing the intensity distribution in the pupil plane. This is made, for example, if the intensity distribution in the plane of the field raster elements is non-homogeneous. If field and pupil raster elements have similar positions, the pattern is transferred to the pupil illumination. The intensity can be homogenized by intermixing.

Advantageously the individual components of field raster element plate, pupil raster element plate, and field mirror of the illumination system are arranged in the beam path such that the beam course is as free of vignetting as possible. If such an arrangement has effects on the imaging, then the individual light channels and the field lenses must be re-optimized.

Illumination systems for EUV lithography can be obtained with the previously described design process for any desired illumination A with two normal-incidence and one to two grazing-incidence reflections. These systems have the following properties:

(i) a homogeneous illumination, for example, of an arc-shaped field (ii) a homogeneous and field-independent pupil illumination (iii) the combining of exit pupil of the illumination system and entrance pupil of the objective (iv) the adjustment of a pre-given structural length (v) the collection of the maximal possible waveguide value.

Arrangements of field raster elements and pupil raster elements will be described below for one form of embodiment of the invention with field and pupil raster element plates.

First, different arrangements of the field raster elements on the field raster element plate will be considered. The intensity distribution can be selected as desired.

The depicted examples are limited to simple geometric shapes, such as circle, rectangle, and the coupling of several circles or rectangles. The intensity distribution will be homogeneous within the illuminated region or slowly varying. The aperture distribution will be independent of the field.

Figure 7:
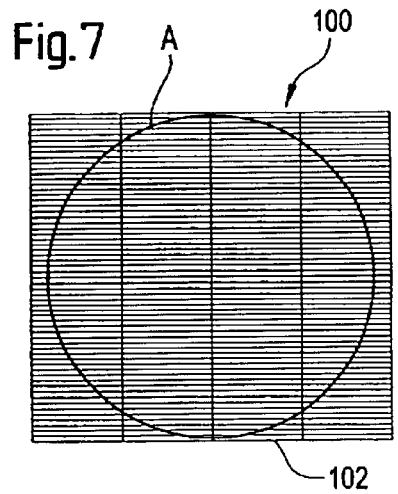
FIGS. 7–14: different arrangements of field raster elements on a field-raster element plate.
Figure 8:
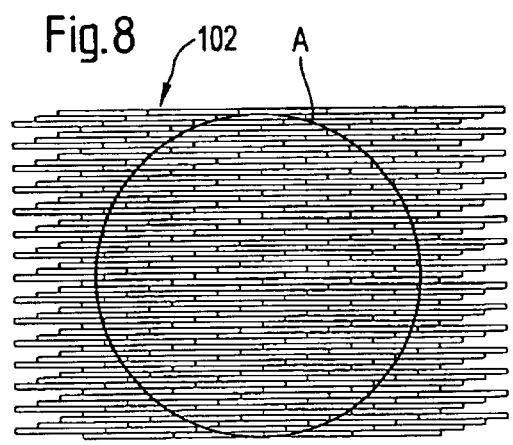

In the case of circular illumination A of field raster element plate 100, field raster elements 102 may be arranged, for example, in columns and rows, as is shown in FIG. 7. Alternatively, the center points of the raster elements can be distributed uniformly by shifting the rows over the surface, as is shown in FIG. 8. The latter distribution is better adapted to a uniform distribution of the secondary light sources.

Figure 9:
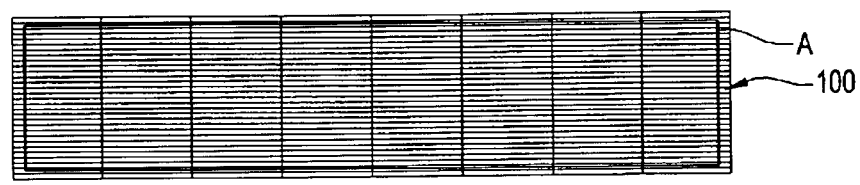
Figure 10:
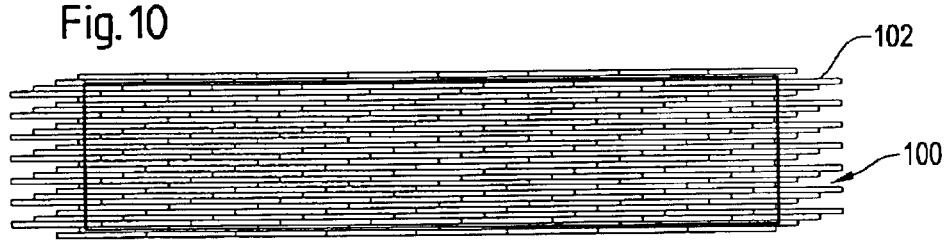

A rectangular illumination A is shown in FIG. 9. A shifting of the rows, as shown in FIG. 10, leads to a more uniform distribution of the secondary light sources. These are arranged, however, according to the extension of the field raster element plate within a rectangle. In order to be able to distribute the secondary light sources in the circular diaphragm plane, a double facetting is provided. The pupil raster elements sit at the site of the secondary light sources. In the case of rectangular illumination, it is necessary to tilt the field raster elements in order to produce a light path between field and pupil raster elements, such that the beams impinge on the pupil raster elements, which are arranged, for example within a circle, and which also must be tilted.

Figure 11:
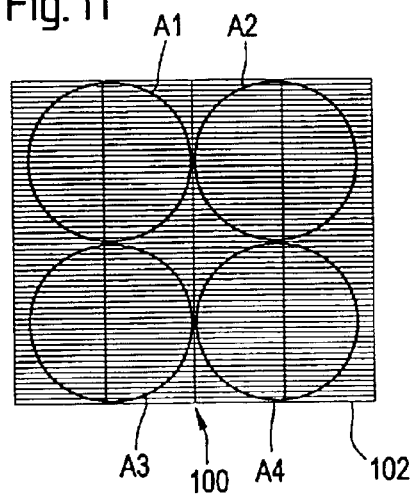
Figure 12:
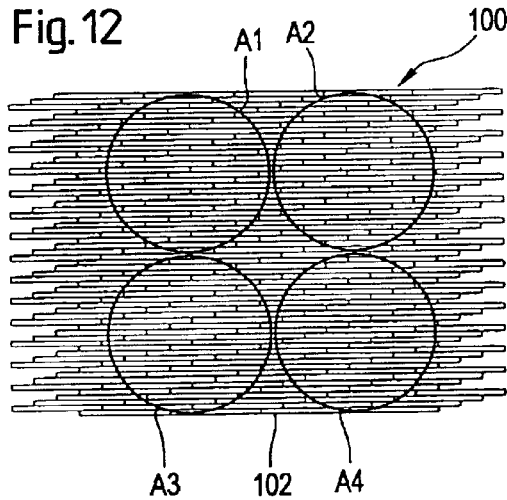

If the illumination A of field raster element plate 100 comprises several circles A1, A2, A3, A4, for example, by coupling of different beam paths of one or more sources, then with the same raster element size the intermixing is insufficient in the case of an arrangement of the raster elements in rows and columns according to FIG. 11. A more uniform illumination is obtained by shifting the raster element rows, as shown in FIG. 12.

Figure 13:
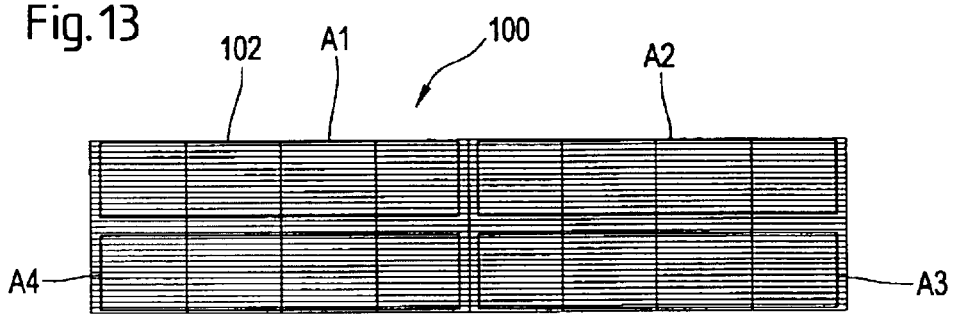
Figure 14:
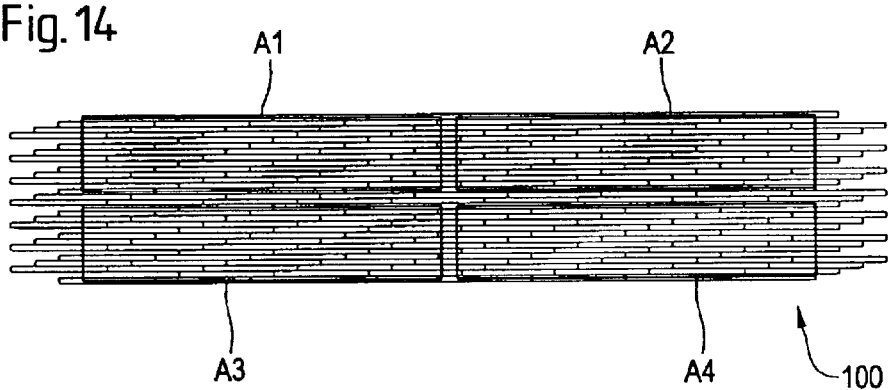

FIGS. 13 and 14 show the distribution of field raster elements 102 in case of combined illumination from individual rectangles A1, A2, A3, A4.

Now, for example, arrangements of the pupil raster elements on the pupil raster element plate will be described.

Two points of view are to be considered in arranging the pupil raster elements:

1. For minimizing the tilt angle of field and pupil raster elements for production the light path, it is advantageous to maintain the arrangement of the field raster elements. This is particularly advantageous with an approximately circular illumination of the field raster element plate.
2. For homogenous filling of the pupil, the secondary light sources should be uniformly distributed in the entrance pupil of the objective. This can be achieved by providing a uniform raster pattern of secondary light sources in the entrance pupil of the objective. These are imaged counter to the direction of light with the field lens in the plane of the pupil raster elements, and determine in this way will the ideal site of the pupil raster elements.

If the field lens is free of distortion, then the distribution of the pupil raster elements corresponds to the distribution of the secondary light sources. However, since the field lens forms the arc-shaped field, distortion is purposely introduced. This does not involve rotation-symmetric cushion or semicircular distortion, but the bending of horizontal lines into arcs. The y-distance of the arcs remains constant in the ideal case. Real grazing-incidence field mirrors, however, also show an additional distortion in the y-direction.

Figure 15:
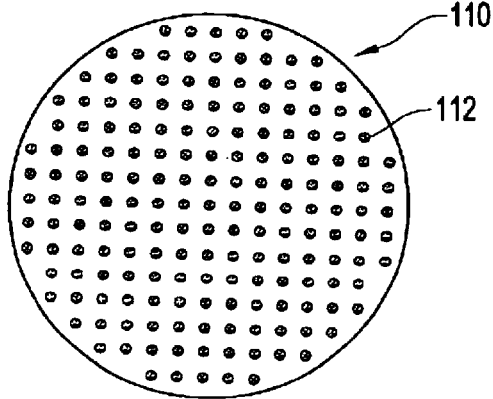
FIGS. 15–17 raster of secondary light sources in the entrance pupil of the objective.

A raster 110 of secondary light sources 112 in the entrance pupil of the objective, which is also the exit pupil of the illumination system, is shown in FIG. 15, as it had been produced for distortion-free imaging. The arrangement of secondary light sources 112 corresponds precisely to the pre-given arrangement of the pupil raster elements.

Figure 16:
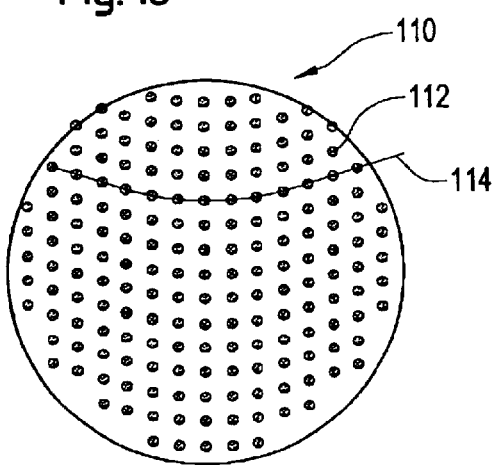

If the field lenses are utilized for arc-shaped field-formation as in FIG. 16, then secondary light sources 112 lie on arc 114.

If the pupil raster elements of individual rows are placed on an arc, which compensate for the distortion, then one can place the secondary light sources again on a regular raster.

Figures 17, 18, 19:
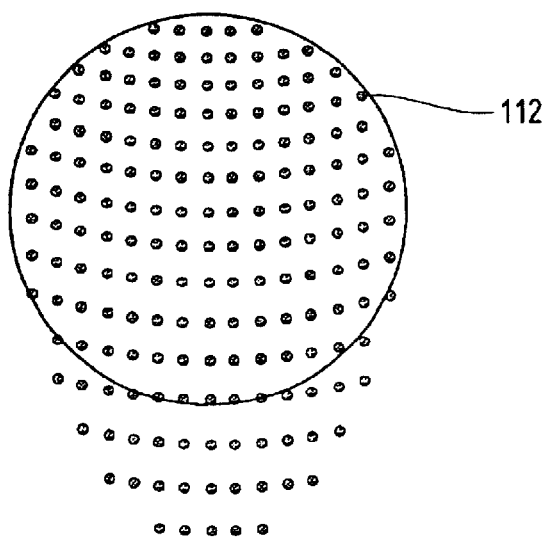
FIGS. 18–20: relationship between illuminated surfaces of field raster element plate and pupil raster element plate as well as structural length and numerical aperture in the reticle plane.

If the field lens also produces distortion in the y-direction, the pupil is distorted in the y-direction, as shown in FIG. 17.

The extent of the illuminated area onto field raster element plate is determined by the input illumination. The illumination of the pupil raster element plate is determined by the structural length and the aperture in the reticle plane.

As described above in detail, the two surfaces must be fine-tuned to one another by rotation and tilting of the field and pupil raster elements.

For illustration, the problems of this principle will be explained for refractive designs. The examples can be transferred directly, however, to reflective systems. Various configurations can be distinguished for a circular illumination of the field raster element plate, as shown below.

If a converging effect is introduced by tilting the field raster elements, and a divergent effect is introduced by tilting the pupil raster elements, then the beam cross section can be reduced. The tilt angles of the individual raster elements are determined by tracing the center rays for each pair of raster elements. The center rays hit the corresponding raster elements in the center. The system acts like a telescope-system for the central rays, as shown in FIG. 18.

How far the field raster elements must be tilted depends on the convergence of the impinging beam. If the convergence is adapted to the reduction of the beam cross section, the field raster elements can be introduced on a planar substrate without a tilting angle.

A special case results if the convergence between field and pupil raster element plate corresponds to the aperture at the reticle, as shown in FIG. 19.

No divergent effect must be introduced by the pupil raster elements, so they can be utilized without tilting. If the light source also possesses a very small waveguide value and the secondary light sources are nearly point-like, the pupil raster elements can be completely dispensed with.

Figure 20:
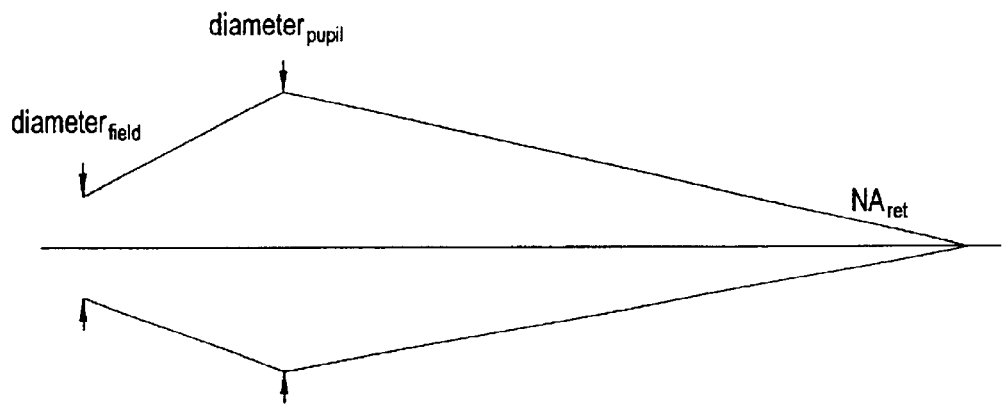

A magnification of the beam cross section is possible, if a diverging effect is introduced by tilting the field raster elements, and a collecting effect is introduced by tilting the pupil raster elements. For the central rays, the system operates as a retro-focus system, as shown in FIG. 20.

If the divergence of the impinging radiation corresponds to the beam divergence between field and pupil raster elements, then the field raster elements can be used without tilting.

Instead of the circular shape that has been described, rectangular or other shapes of illumination A of the field raster element plate are possible.

The arrangements shown in FIGS. 21–56 described below show an embodiment of the invention for which undulators are used as synchrotron radiation light sources, without the invention being limited thereto.

The radiation of the undulator light source can be described as a point light source with strongly directed radiation, for example, the divergence both in the horizontal as well as the vertical direction is less than 10 mrads. Therefore, all illuminating systems described below as examples have only one mirror or one lens with raster elements, without the invention being limited thereto.

Undulator sources have in a predetermined plane in which a predetermined wavelength spectrum is irradiated, a beam divergence of <100 mrads, preferably <50 mrads. Therefore, collectors along the electron path for collecting the synchrotron radiation and bundling it, as described, for example, in U.S. Pat. No. 5,439,781 or U.S. Pat. No. 5,512,759 are not necessary for such sources.

Three possible configurations of an illumination system with a light source, which is shown in this particular embodiment as an undulator source 200, without being limited thereto, and a mirror with raster elements, will be described below.

Here:

Type A describes an embodiment, in which the individual raster elements of the first mirror are individual tilted planar facets.

Type B describes an embodiment, in which the individual raster elements are designed as raster elements with positive optical power in a convergent beam path.

Type C describes an embodiment, in which the raster elements of the first mirror form one structural unit with the last optical element of the collector unit, which is a collective mirror or collective lens.

Figure 21A:
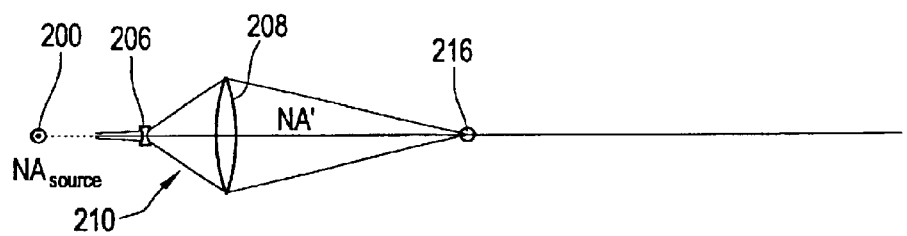
FIGS. 21A–21B: a first embodiment of an illumination system with an undulator light source (type A) in refractive presentation.
Figure 21B:
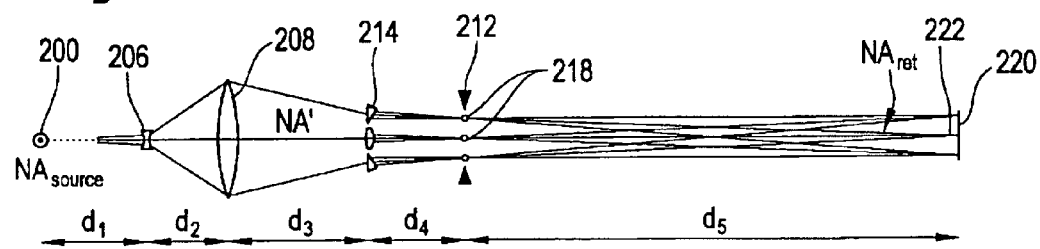

An illumination system according to type A in a refractive form is shown for the definition of the parameters in FIGS. 21A and 21B. In an embodiment according to type A, the means for beam broadening comprises a diverging lens 206 or diverging mirror, without being limited thereto.

The collecting effect for producing the secondary light sources is introduced by the collective mirror or collective lens 208 situated behind the diverging lens or diverging mirror 206. The means for beam broadening and the mirror or the lens with collecting effect form a so-called collector unit or a collecting system 210. If a mirror with raster elements is not present, the collective mirror would image source 200 in the diaphragm plane 212 of the illumination system. The secondary light source 216 is decomposed into a plurality of secondary light sources 218 by the mirror with raster elements 214 or the facetted mirror.

The raster elements 214 can be formed as planar facets, since the secondary light sources or light sources in this form of embodiment are imaged in the diaphragm plane by means of the collector unit.

The facets are tilted at angles with respect to one another or with respect to a plane of reference. The tilting angles of the planar facets are such that the center rays of the facets converge, i.e., intersect, at an optical axis 222 in the image plane 220. For the center rays, the facetted mirror or lens acts as a divergent mirror or lens. For illustration purposes, FIGS. 21A and 21B show the schematic structure based on a refractive, linearly constructed system. The facetted lens is not shown in FIG. 21A. The secondary light source 216 lies in the diaphragm plane. The facetted lens 214 is inserted in FIG. 21B. The arrangement of individual prisms in the refractive presentation corresponds to the tilt of the facets.

Figure 22A:
FIGS. 22A–22B: a second embodiment of an illumination system with an undulator light source (type B) in refractive presentation.
Figure 22B:
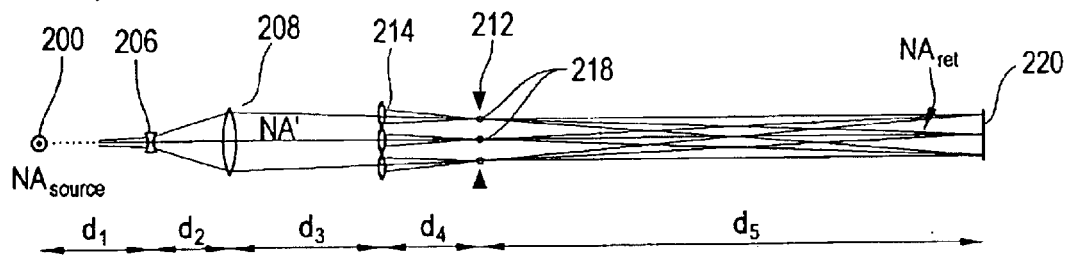

An arrangement of the facetted mirror or lens in the convergent beam path according to type B as shown in FIGS. 22A and 22B is also possible. The collective mirror 208 is designed in such a way that the source 200 is imaged in the image plane 220 of the illumination system, as shown in FIG. 22A. The positive optical power of facets 214 is then designed such that secondary light sources 218 are produced in the diaphragm plane 212, as shown in FIG. 22B.

Figure 23A:
FIGS. 23A–23B: a third embodiment of an illumination system with an undulator light source (type C) in refractive presentation.
Figure 23B:
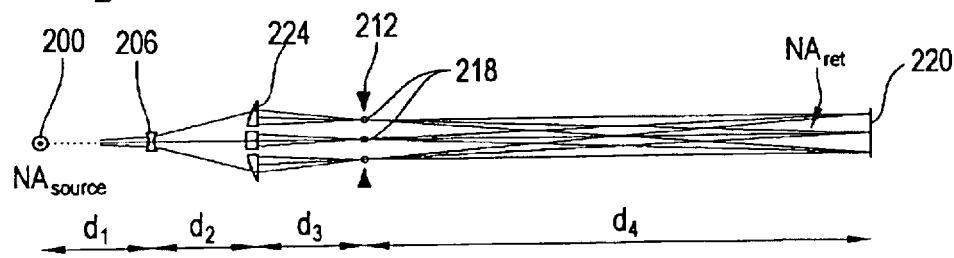

In the embodiment of the invention according to type C, as shown in FIGS. 23A and 23B, the collective mirror or collective lens and the facetted mirror or lens are combined. In such a configuration, the collecting effect of the collector mirror is achieved by the individual tilts of the raster elements. The facets or raster elements are shown as a superimposition of prisms and a collective lens in the schematic presentation in FIGS. 23A and 23B. In a reflective embodiment, this would be realized with a plurality of tilted raster elements 224. As described before, illumination systems according to type C comprise at least a device for producing secondary light sources that includes at least a facetted mirror. The facetted mirror is divided into field raster elements. The field raster elements are tilted to have a converging effect to a diverging light beam, which impinges onto the facetted mirror. The field raster elements divide the impinging light bundle into a plurality of light bundles, where each light bundle is associated with a raster element and each light bundle has a center ray. The center ray of each light bundle is the ray traveling through the center of the corresponding field raster element.

In this application a converging effect of the facetted mirror means that the center rays that travel divergent to the optical axis of the illumination system before being reflected by the facetted mirror, are reflected at the raster elements such that they travel convergent to the optical axis after being reflected by the facetted mirror. The optical axis of the illumination system is defined by the direct lines between the centers of the components of the illumination system. In a preferred embodiment at least two of the center rays of two different field raster elements intersect in the image plane, which means that they are collected in the image plane. Thus the images of the field raster elements in the image plane at least partially superimpose.

Figure 23C:
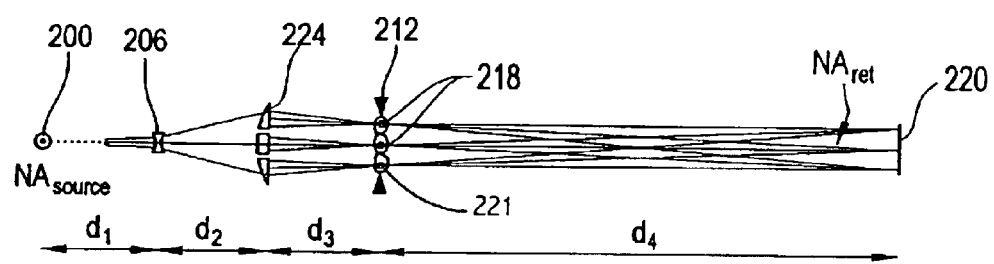
FIG. 23C an illumination system having a field raster element plate and a pupil raster element plate.

FIG. 23C shows an enhancement of the illumination system of FIG. 23B that includes a plurality of pupil raster elements 221 on a pupil raster element plate. In this case, raster elements 224 are field raster elements. Pupil raster elements 221 are located at or nearby a site of secondary light sources 218.

A first pupil raster element 221 receives and directs a first bundle of light from a first field raster element 224. A second pupil raster element 221 receives and directs second bundle of light from a second field raster element 224. The first pupil raster element 221 images the first field raster element 224 in an image plane 220, and the second pupil raster element 221 images the second field raster element 224 in image plane 220. Thus, there is a one-to-one correlation between field raster elements 224 and pupil raster elements 221.

The following formulas describe the imaging by the field raster elements for the illumination arrangement according to types A–C:

$$NA_{Ret} = \frac{\frac{DU_{BL}}{2}}{d_5} \Rightarrow DU_{BL} = 2 \cdot d_5 \cdot NA_{Ret}$$

$$\frac{DU_{BL}}{x_{Wabe}} \cdot \frac{d_4 + d_5}{d_5} = 4.0 \Rightarrow x_{Wabe} = \frac{DU_{BL}}{4.0} \cdot \frac{d_5}{d_4 + d_5}$$

$$\beta_{Wabe} = \frac{x_{Feld}}{x_{Wabe}} = \frac{d_5}{d_4} \Rightarrow \beta_{Wabe} = \frac{x_{Feld}}{x_{Wabe}}$$

$$\Rightarrow d_4 = \frac{d_5}{\beta_{Wabe}}$$

wherein the abbreviations denote

Wabe=field raster element=FRE

DU=diameter

Feld=field

BL=diaphragm $d_5$: measurement for the structural length $NA_{ret}$: aperture in the reticle plane.

$X_{Feld}$: x-extension of the field.

$DU_{BL}$: diameter of the diaphragm $x_{Wabe}$: x-extension of the raster element $y_{Wabe}$: y-extension of the raster element The number of field raster elements in a field raster element row corresponds to four (4) in the embodiment above. The number of raster elements is a measure for the number of secondary light sources, the uniformity of the field and the uniform illumination of the pupil.

If the illumination systems shown in FIGS. 21A to 23B being examples for refractive systems are designed for 13-nm EUV radiation, then these systems must be reflective systems for 13-nm radiation with as few reflections as possible due to the high reflection losses.

In a case where an undulator light source is used, a beam-broadening means, such as a divergent mirror or lens having negative optical power, is used. The divergent mirror can be combined with a collective mirror having positive optical power forming a collector unit for illuminating the mirror with raster elements.

For an undulator source, the collector unit for 13-nm radiation can comprise a first grazing-incidence mirror or a scanning mirror, which broadens the beam bundle of radiation emitted by the undulator light source, and a second normal-incidence mirror, which forms a convergent beam bundle. The convergent beam bundle impinges onto the first mirror, which is divided into raster elements.

In order to achieve an advantageous design in the case of 13-nm wavelength, due to the higher reflectivity, grazing-incidence mirrors (R≈80%) are preferred over normal-incidence mirrors (R≈65%).

Advantageously, the distance $d_1$ from the source to the first mirror should be at least $d_1$=3000 mm. In the case of such an embodiment, a free space of 2000 mm should be maintained between the first mirror and the remaining optics for the radiation-protection wall.

Alternatively to the arrangement with a first mirror in front of the radiation-protection wall and second mirror behind this wall, the first mirror can also be placed behind the radiation-protection wall with $d_1$>5000 mm. It can be designed as a grazing-incidence or normal-incidence mirror.

field mirrors 306, 308 are formed as grazing-incidence field mirrors and form the field in the reticle plane.

The system parameters can be designed such that the optical axis is tilted only around the x-axis (α-tilt). The meridional plane remains the same. The distances between the mirrors are adapted to the boundary conditions of the source.

Such a type A system is described in detail below.

Individually tilted planar facets are used as raster elements. The undulator source was assumed to be a homogeneous surface radiator with a diameter of 1.0 mm and $NA_{undulator}$=0.001.

Figure 25:
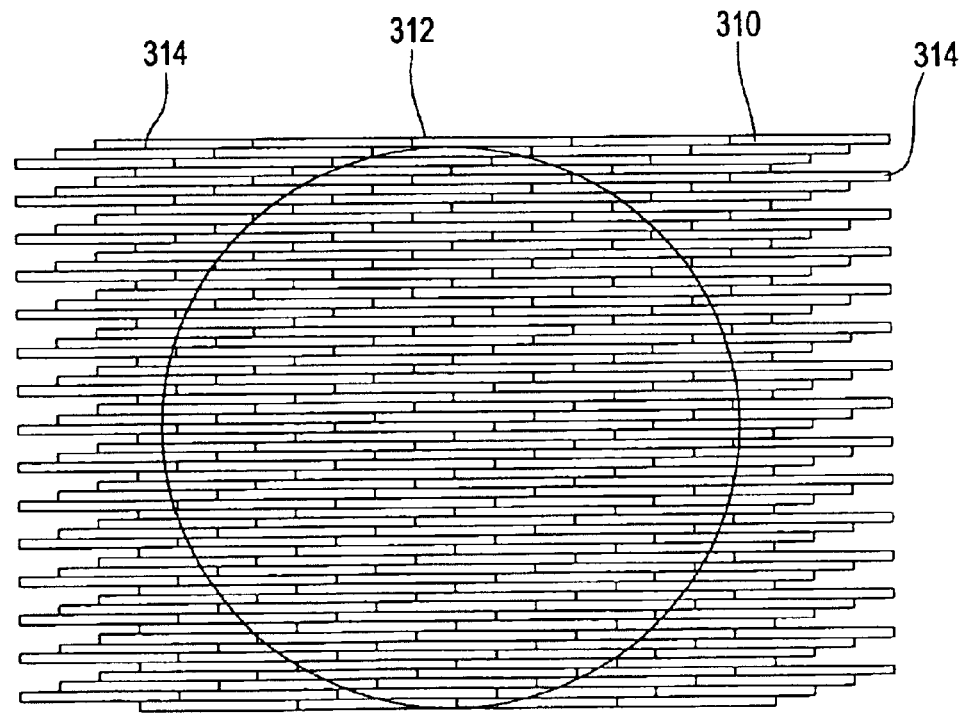
FIG. 25: arrangement of the raster elements on the first facetted mirror.

The facet rows 310 were arranged in a displaced manner relative to one another for the uniform distribution of the secondary light sources in the diaphragm plane, as shown in FIG. 25. The circle 312 in FIG. 25 shows the illumination of the mirror with raster elements, which are planar facets 314 by the broadened undulator source 200.

The arrangement of the mirrors relative to the coordinate system of the source, of the type A illumination system shown in FIGS. 26 to 33 is given in the following Table 1.

TABLE 1

| Arrangement of the mirrors for type A | | | | | | | | |
|---|---|---|---|---|---|---|---|---|
| Component | X [mm] | Y [mm] | Z [mm] | α [°] | β [°] | γ [°] | AOI [°] | |
| Source | 0.000 | 0.000 | 0.000 | 0.000 | 0.000 | 0.000 | 0.000 | — |
| Divergent mirror | 0.000 | 0.000 | 5000.000 | 80.000 | 0.000 | 0.000 | 80.000 | g.i. |
| Collecting mirror | 0.000 | 1026.060 | 7819.078 | −15.000 | 0.000 | 180.000 | 5.000 | n.i. |
| Mirror with field raster elements | 0.000 | 878.459 | 6981.991 | 155.000 | 0.000 | 0.000 | 15.000 | n.i. |
| Diaphragm | 0.000 | 1007.017 | 7135.200 | −40.000 | 0.000 | 180.000 | 0.000 | — |
| Field mirror 1 | 0.000 | 1906.231 | 8206.842 | 38.858 | 0.000 | 180.000 | 78.858 | g.i. |
| Field mirror 2 | 0.000 | 2039.021 | 8276.605 | 16.573 | 0.000 | 0.000 | 78.857 | g.i. |
| Reticle | 0.000 | 2287.899 | 8300.263 | 90.000 | 180.000 | 0.000 | 5.430 | n.i. |
| EP objective | 0.000 | 68.158 | 8511.263 | 90.000 | 0.000 | 0.000 | 0.000 | — |

Advantageously, the undulator light source irradiates in the horizontal direction.

The horizontally situated reticle is illuminated at a principal beam angle of at most 20°, preferably 10°, and most preferably 5.43°.

A horizontal arrangement of reticle and wafer is necessary to avoid a bending of the optics in the gravitational field.

Advantageously, two grazing-incidence field mirrors are used for forming the field, in order to illuminate the reticle with correct annular orientation and to deflect the light separated from the illumination system into the objective. The two grazing incidence mirrors are arranged between the first mirror, which is divided into raster elements, and the image plane of the illumination system. The reticle is situated in the image plane of the illumination system.

Figure 24:
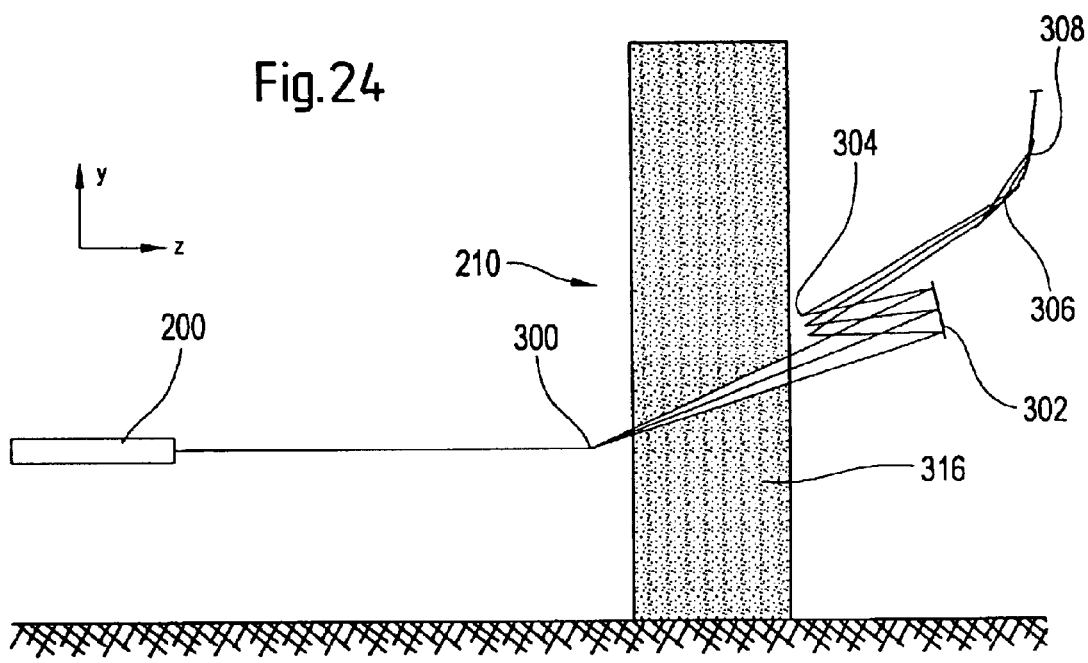
FIG. 24: principal arrangement of a type A illumination system in reflective presentation.

Illumination systems according to types A and B are shown in FIG. 24 in schematic representation.

The system according to types A and B comprises a divergent mirror 300, which is formed as a grazing-incidence toroidal mirror, which broadens the beam rays emitted by the light source, and a normal-incidence collector mirror 302, which illuminates the mirror with raster elements 304 in a round manner and projects the light source either in the diaphragm plane (type A) or in the reticle plane (type B). In type A and B-systems therefore a convergent light bundle impinges onto the facetted mirror.

The reference number 304 designates the normal-incidence facetted mirror or mirror with raster elements. The X, Y, Z: origin of the coordinates of the components.

α, β, γ: rotation angle around the x-, y-, and z-axis. The angles are referred to the coordinate system of the source.

AOI: angle of incidence of the optical axis at the components g.i./n.i.: grazing incidence/normal incidence.

The z-axis of the reticle plane is at 90° relative to the z-axis of the source coordinate system.

The z-distance between source 200 and divergent mirror 300 is 5000 mm in the system described below. For radiation-protection wall 316, a z-distance of 1900 mm is provided between collector mirror 300 and facetted mirror 304.

The reticle plane 318 lies 2287.9 mm above the source.

The design will now be described on the basis of FIGS. 26 to 33.

Figure 26:
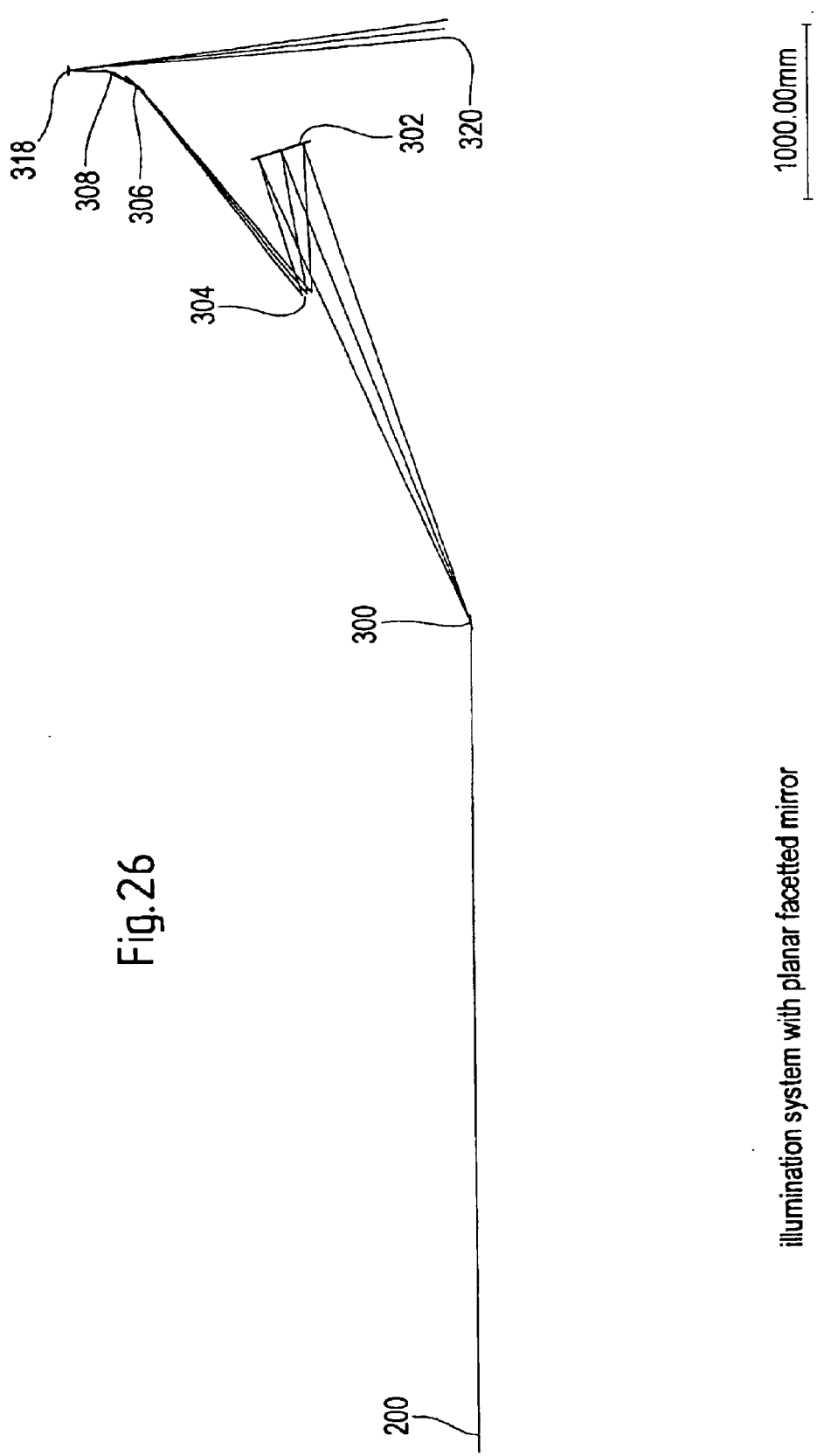
FIGS. 26–29: a configuration of a type A illumination system.

FIG. 26 shows the entire system up to the entrance pupil 320 of the objective in the yz-section including source 200 and divergent mirror 300, collective mirror 302, planar facetted mirror 304, field mirrors 306, 308, reticle plane 318 and entrance pupil 320 of the objective. The center rays are indicated for the central field raster elements (0,0) and the two field raster elements with the greatest distance to the central field raster element. The beams intersect in reticle plane 318 and illuminate the entrance pupil 320 of the objective.

Figure 27:
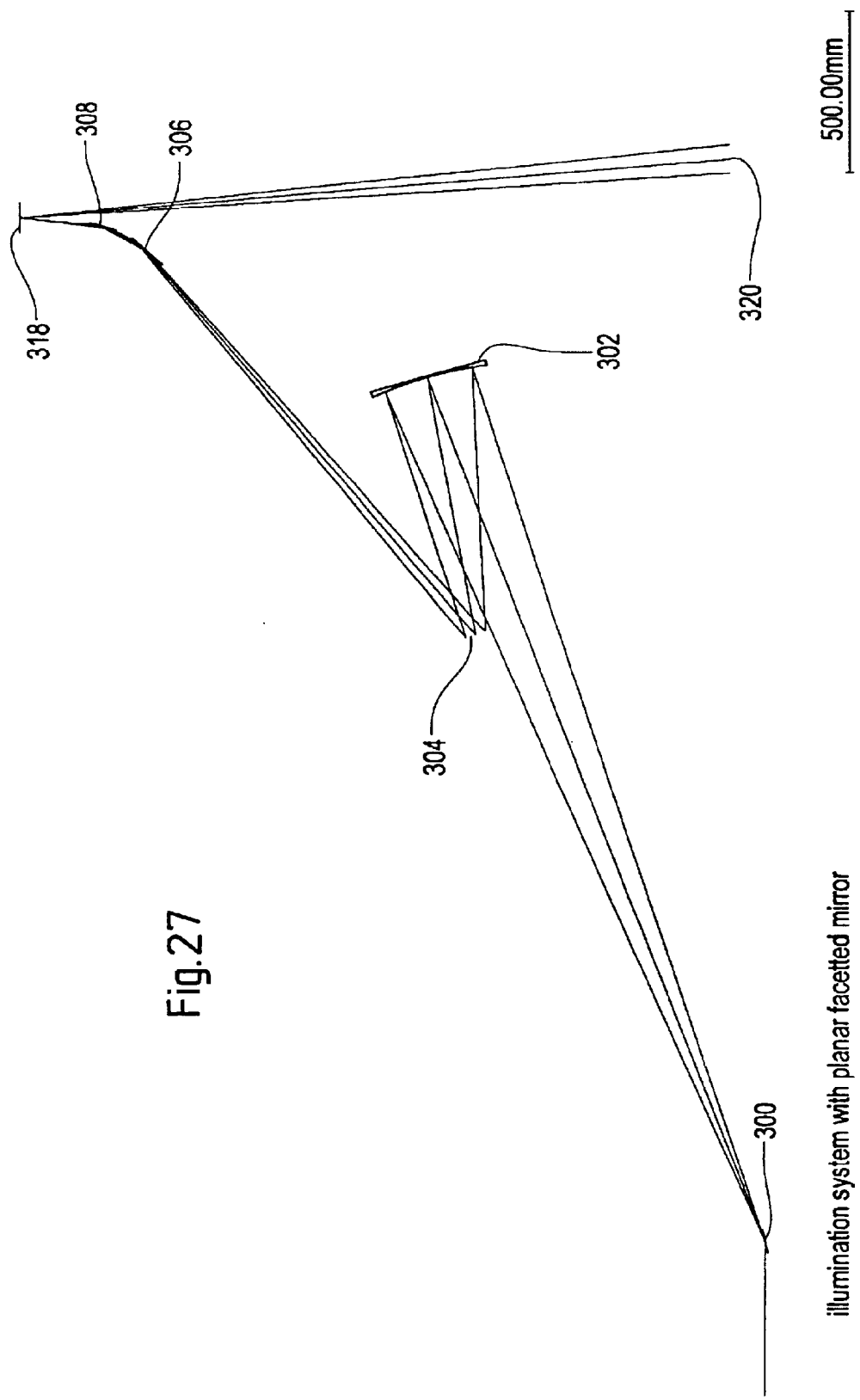

FIG. 27 shows a part of the illumination system beginning with the divergent mirror 300. The beam deflection of the center rays due to the tilted facets on the facetted mirror 304 can be clearly seen.

Figure 28:
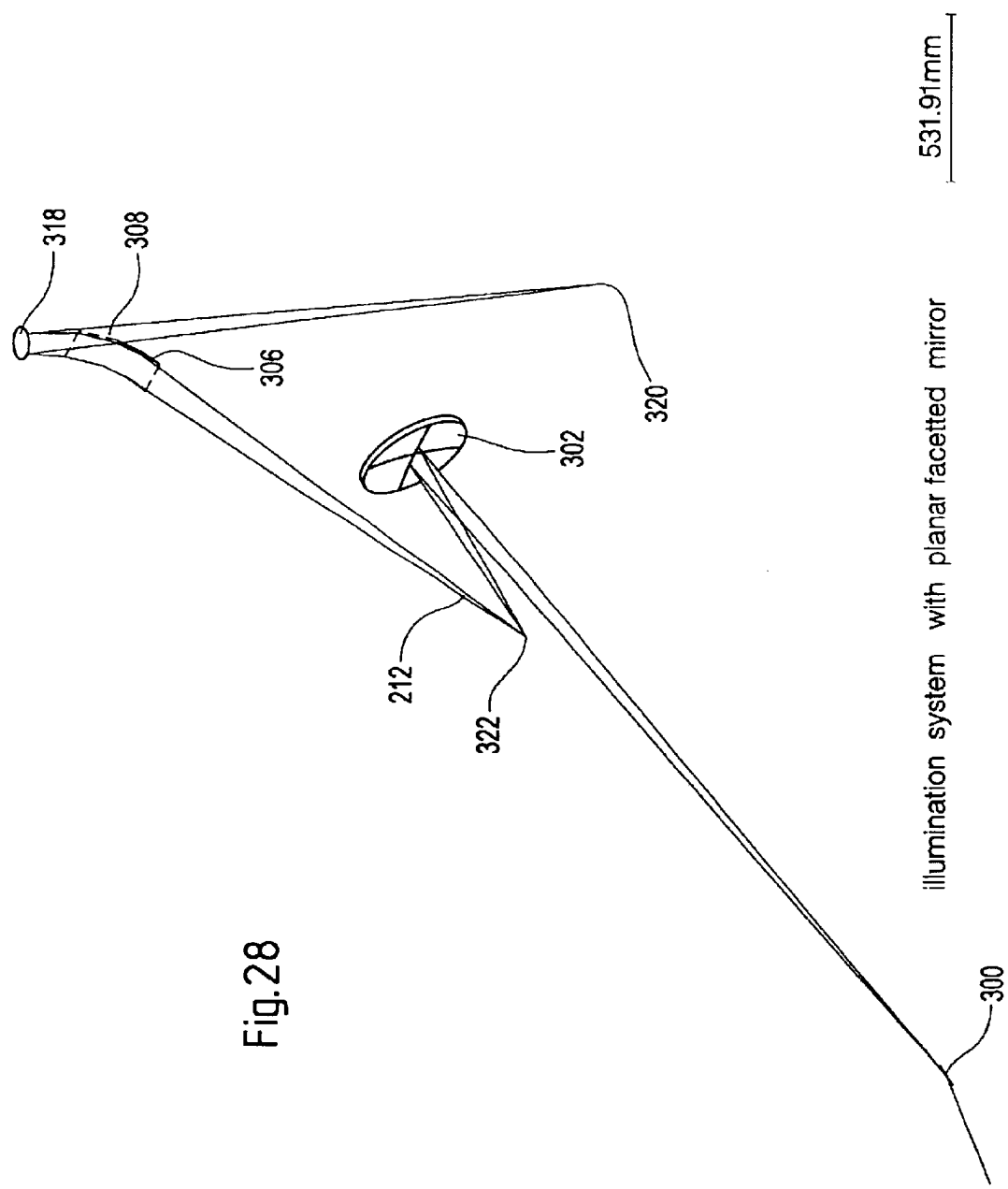

FIG. 28 shows a beam bundle traveling through the illumination system, which impinges onto the central raster element (0, 0) 322 of the first mirror. The collector mirror 302 produces the secondary light source 212 in the diaphragm plane. The field mirrors form the arc-shaped field and images the secondary light sources in the entrance pupil 320 of the objective.

Figure 29:
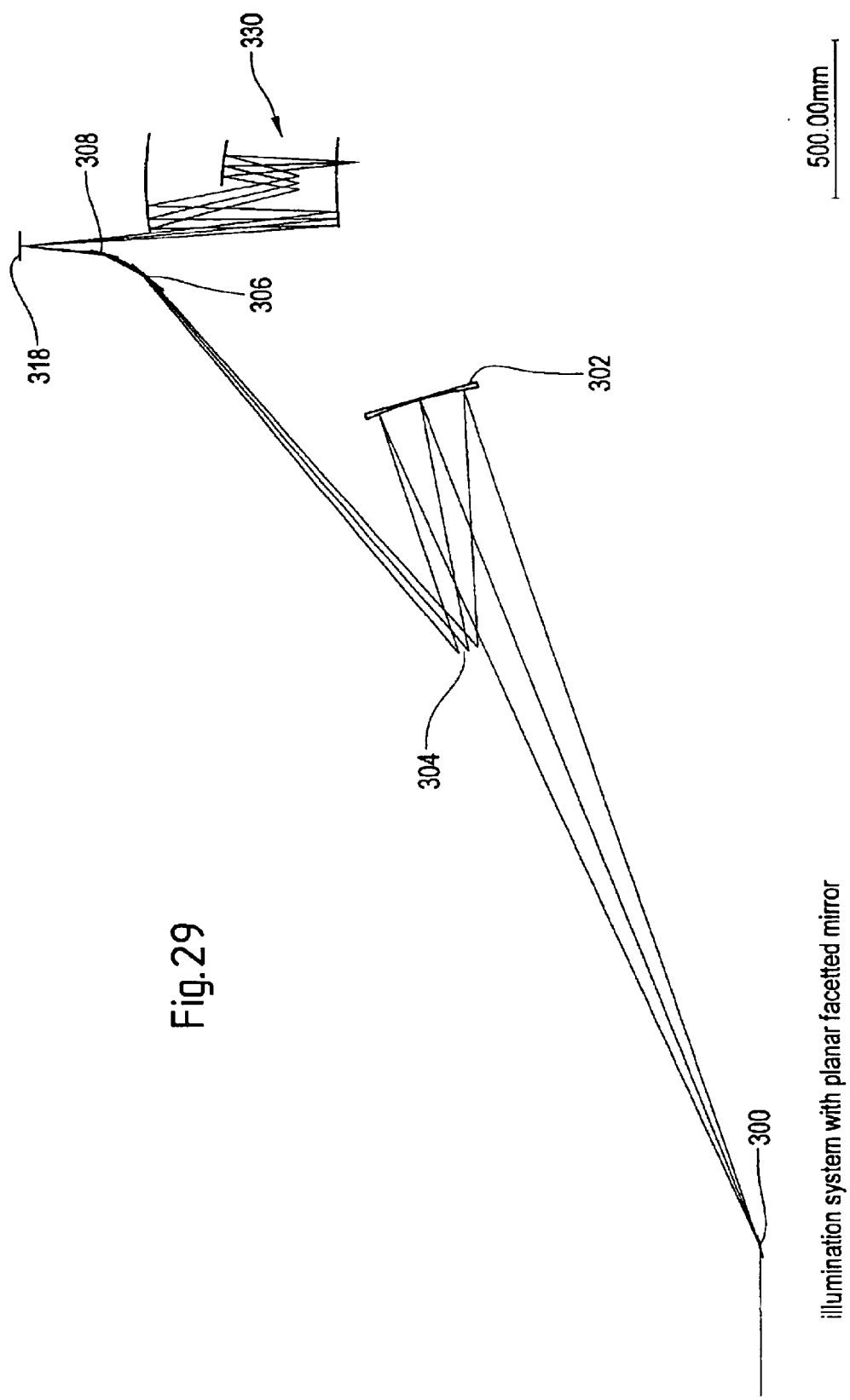

FIG. 29 shows the entire system with objective in yz-section, comprising: divergent mirror 300, collective mirror 302, mirror 304 with planar facets, field mirrors 306, 308, reticle plane 318 and 4-mirror projection objective 330. The beam bundle travels from the illumination system into the projection objective 330. As is apparent from FIG. 29, the illumination system and the projection objective are clearly separated. Projection objectives other than the 4-mirror projection objective are possible, for example, 5-or 6-mirror projection objectives.

Figure 30:
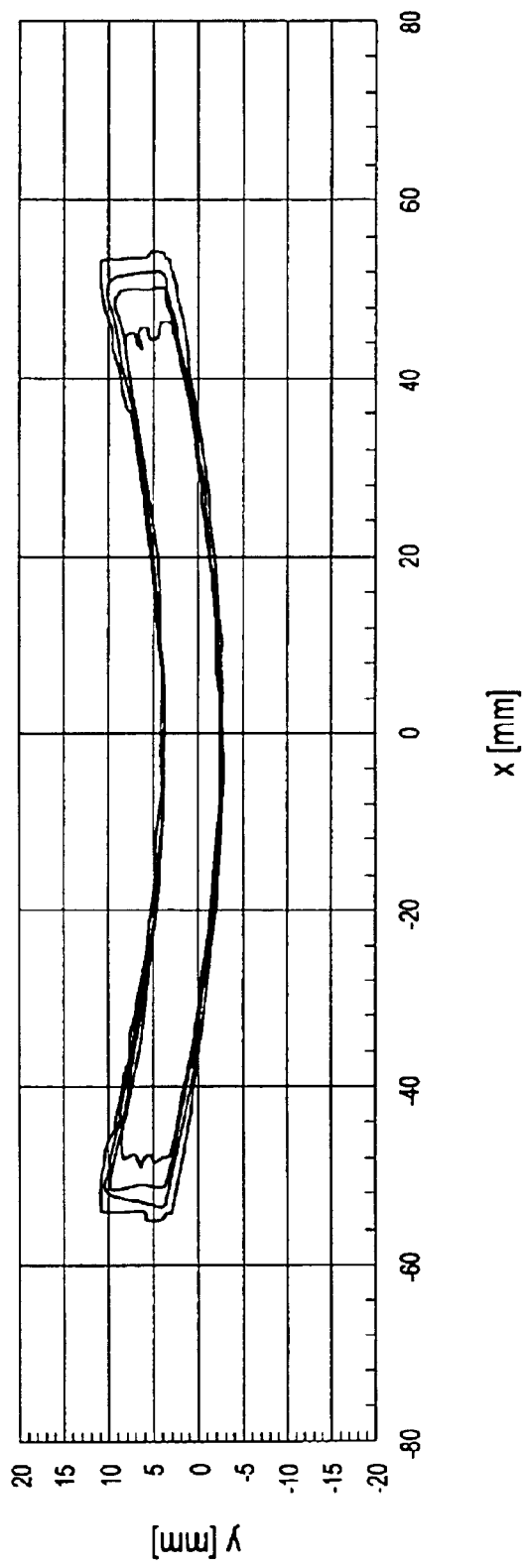
FIGS. 30–33 illumination, intensity distribution, scanning energy and pupil illumination of a system according to FIGS. 26–29.
Figure 31:
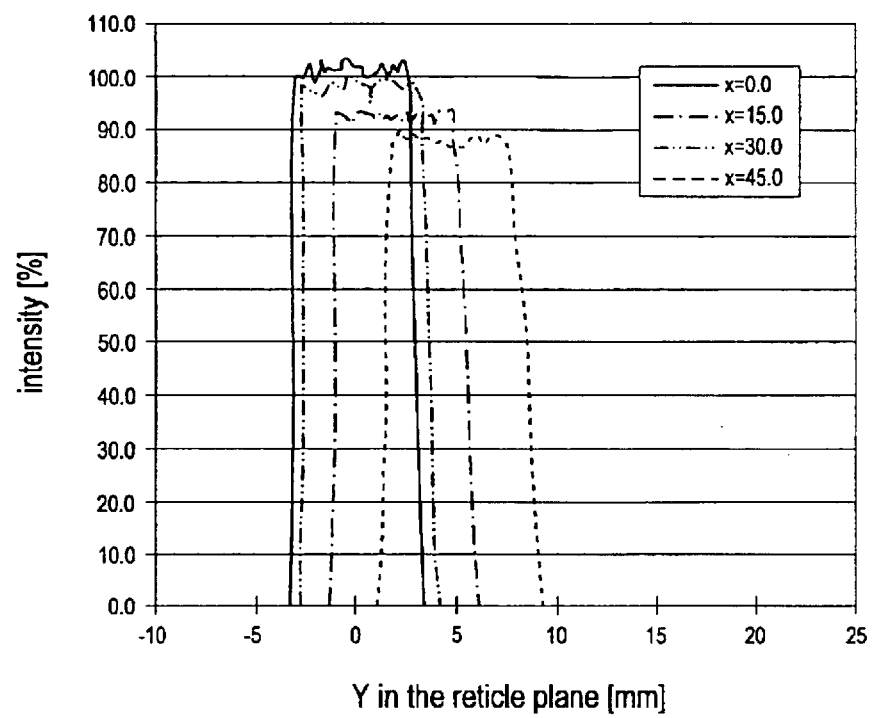
Figure 32:
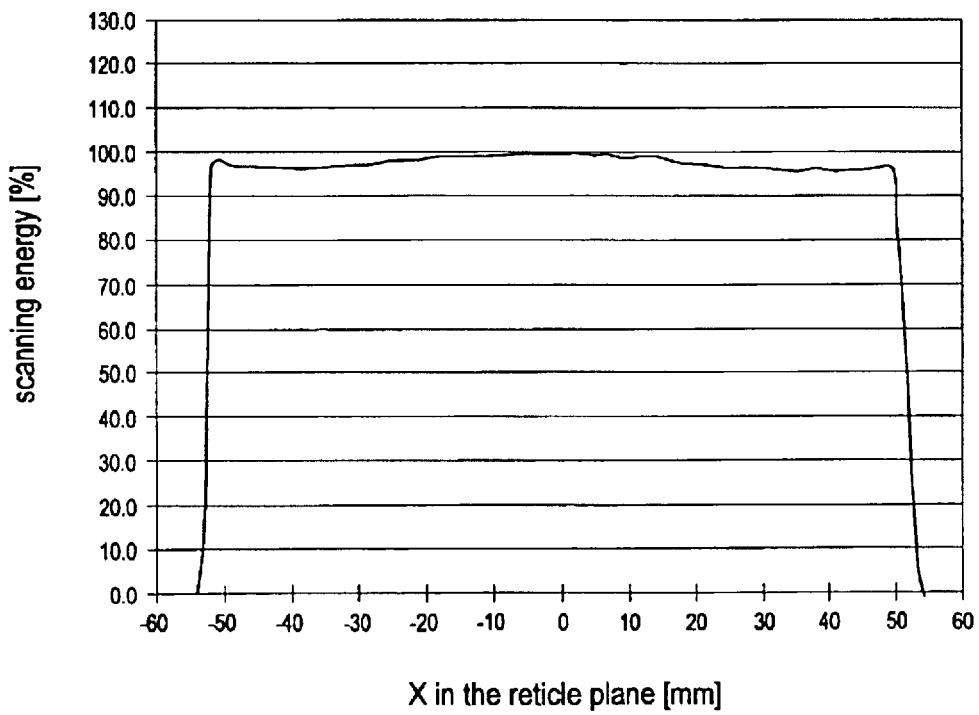

The illumination of the reticle situated in the image plane of an illumination system according to FIGS. 27 to 29 with a 300 annular field (r=211 mm; −3.0 mm<Δr<+3.0 mm) in a contour-line representation is shown in FIG. 30. r denotes the ring radius of the arc-shaped field shown in FIG. 30. The ring radius is the distance of the center of the arc-shaped field to the optical axis of the projection objective An intensity section parallel to the y-axis at x=0.0, 15 mm, 30 mm, and 45 mm is shown in FIG. 31. Since the secondary light sources have only minimal extension, an ideal step-like profile results. The width of the intensity profile increases at the edge of the field, due to the radius of the arc-shaped field and the non-optimal superimposition of the images of the raster elements of first mirror 304 in the image plane. In order to keep the scanning energy constant, the maximal intensity decreases to the same extent, by adjusting the intensity distribution in the image plane with one of the field mirrors 306. The integral scanning energy, i.e., the integration of the intensity along the scanning path, is a decisive factor in the lithography process. As shown in FIG. 32, the integral scanning energy is nearly homogeneous in the present embodiment. The integral scanning energy may be controlled by the design of the optical elements, such as field mirrors or field lenses.

Figure 33:
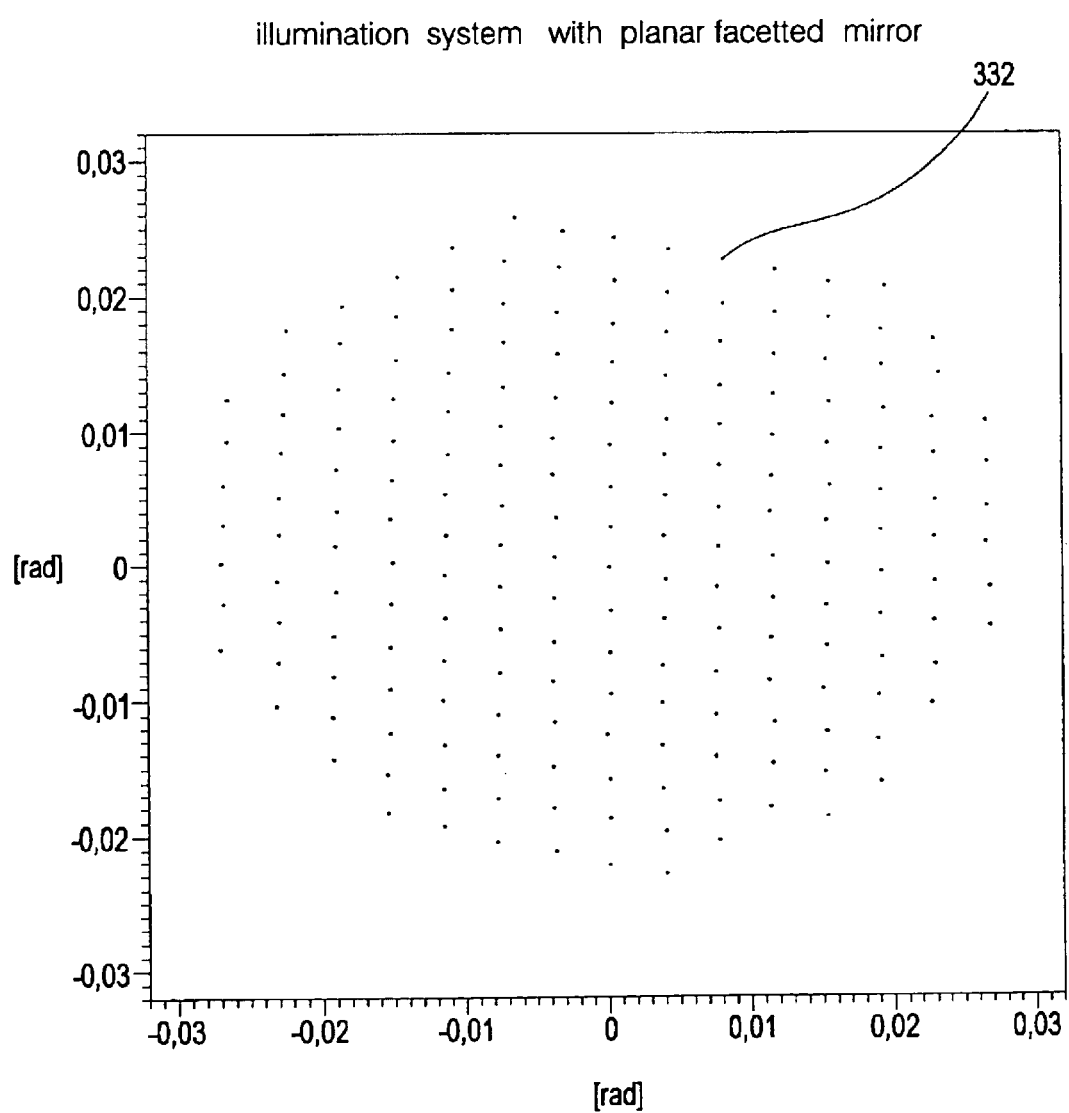

FIG. 33 shows the exit pupil illumination for a field point in the center of the arc-shaped field. Partial pupils 332, which are the images of the secondary light sources in the exit pupil, correspond to the raster element distribution on the first mirror. The maximal numerical aperture amounts to $NA_{ret}$=0.025. The numerical aperture of a partial pupil is negligibly small ($NA_{partial\ pupil}$=2E-6) corresponding to the small Entendu of the undulator source.

However, a complete filling of the pupil is achieved, when seen as an integral, due to the uniform distribution of the secondary light sources. By wobbling one of the field mirrors or by dynamically deforming the surface of one of the field mirrors the grid of the partial pupils in the exit pupil can be periodically shifted to get a complete filing of the pupil in a time average.

An embodiment of the invention according to type B with a facetted mirror in a convergent beam path is shown in FIGS. 34 to 41. The light source is assumed to be similar to the light source described in the embodiment according to FIGS. 26 to 33. The facets or raster elements are arranged as in FIG. 25 and are formed in this embodiment as concave facets having a positive optical power, which are mounted on a planar support surface.

The arrangement of the mirrors relative to the overall coordinate system of the source is shown in Table 2.

TABLE 2

Arrangement of the mirrors for type B

| Component | X [mm] | Y [mm] | Z [mm] | α [°] | β [°] | γ [°] | AOI [°] | |
|---|---|---|---|---|---|---|---|---|
| Source | 0.000 | 0.000 | 0.000 | 0.000 | 0.000 | 0.000 | 0.000 | — |
| Divergent mirror | 0.000 | 0.000 | 5000.000 | 80.000 | 0.000 | 0.000 | 80.000 | g.i. |
| Collecting mirror | 0.000 | 1026.060 | 7819.078 | −15.000 | 0.000 | 180.000 | 5.000 | n.i. |
| Mirror with field raster elements | 0.000 | 913.189 | 7178.953 | 155.000 | 0.000 | 0.000 | 15.000 | n.i. |
| Diaphragm | 0.000 | 1041.747 | 7332.162 | −40.000 | 0.000 | 180.000 | 0.000 | — |
| Field mirror 1 | 0.000 | 1917.187 | 8375.471 | 38.858 | 0.000 | 180.000 | 78.858 | g.i. |
| Field mirror 2 | 0.000 | 2049.977 | 8445.234 | 16.573 | 0.000 | 0.000 | 78.857 | g.i. |
| Reticle | 0.000 | 2298.855 | 8468.892 | 90.000 | 180.000 | 0.000 | 5.430 | n.i. |
| EP objective | 0.000 | 79.114 | 8679.892 | 90.000 | 0.000 | 0.000 | 0.000 | — |

X, Y, Z origin of the coordinates of the components.

α,β,γ:rotation angles around the x-, y-, and z-axis. The angles are referred to the coordinate system of the source.

AOI: angle of incidence of the optical axis at the components.

g.i./n.i.: grazing incidence/normal incidence.

The z-axis of the reticle plane is at 90° relative to the z-axis of the source coordinate system.

The z-distance between source 200 and collective mirror 302 is 5000 mm. For the radiation-protection wall (not shown), a z-distance between divergent mirror 300 and facetted mirror 304 of 2100 mm is provided.

The reticle plane 318 lies 2298.9 mm above the source.

Figure 34:
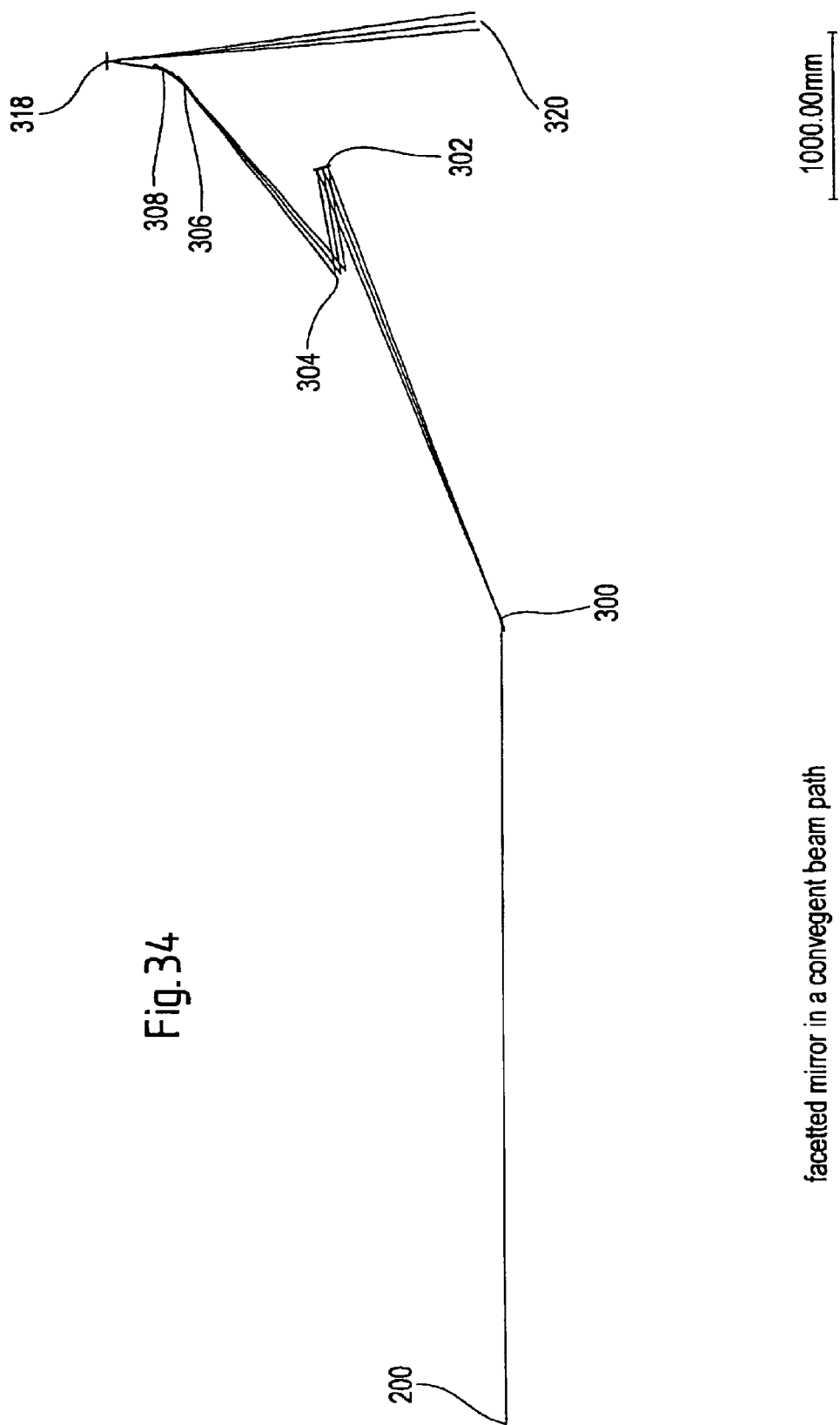
FIGS. 34–37: a configuration of a type B illumination system.

FIG. 34 shows the entire system up to entrance pupil 320 of the objective in the yz-section, comprising: source 200, divergent mirror 300, convergent mirror 302, facetted mirror 304, field mirrors 306, 308, reticle plane 318, entrance pupil of objective 320. The center rays, which intersect each other in the reticle plane 318 and which are drawn up to the exit pupil 320, are indicated for the central field raster element (0,0) and the two field raster elements with the greatest distance to the central field raster element. The center rays in this application are the rays of the beam bundle traveling through the centers of the raster elements.

Figure 35:
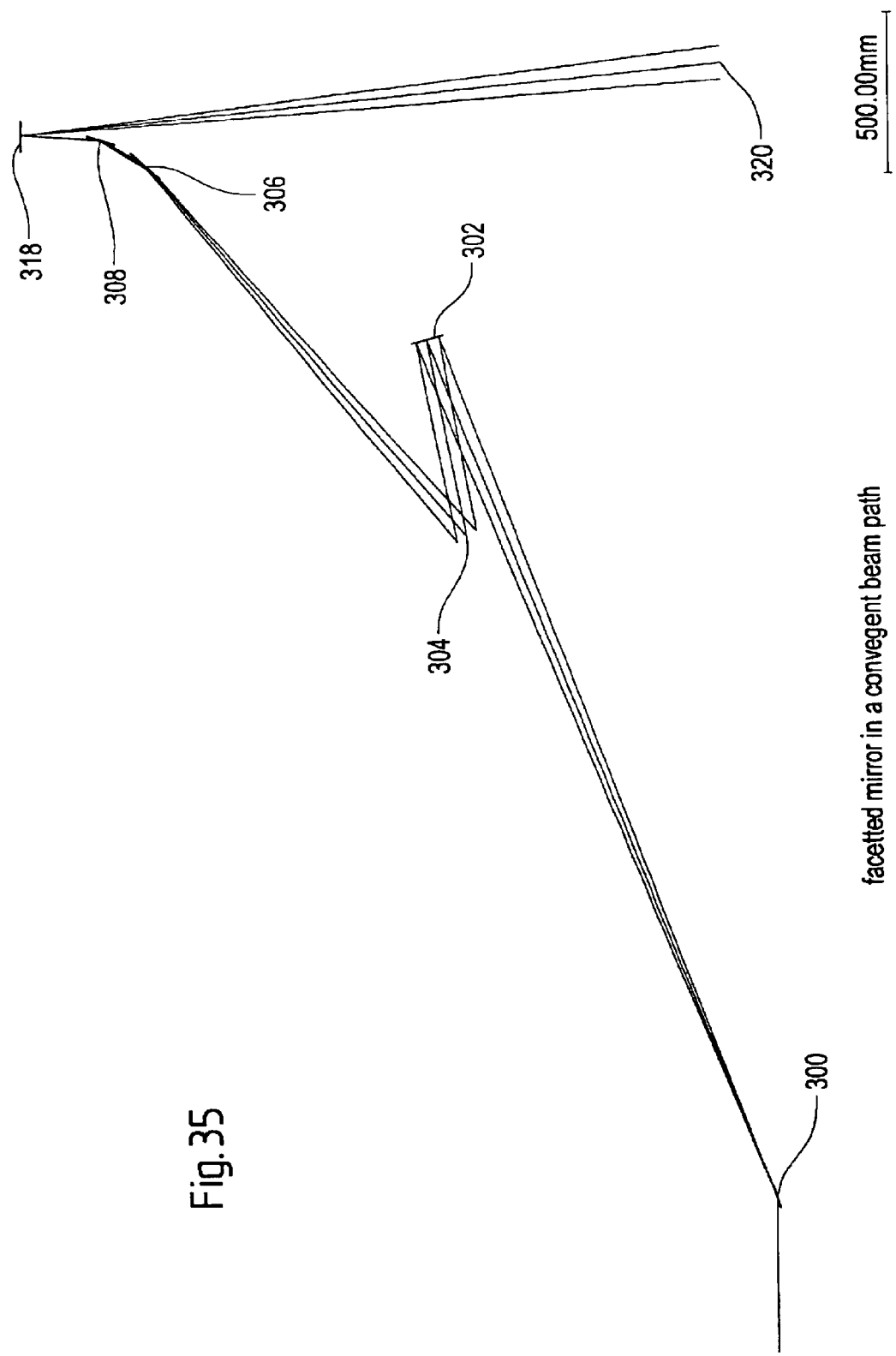

Part of the illumination system beginning at the divergent mirror 300 is shown in FIG. 35. The center rays are not influenced by facetted mirror 304 since the facetted mirror 304 is made of concave raster elements attached to a planar mirror substrate without tilt angles.

Figure 36:
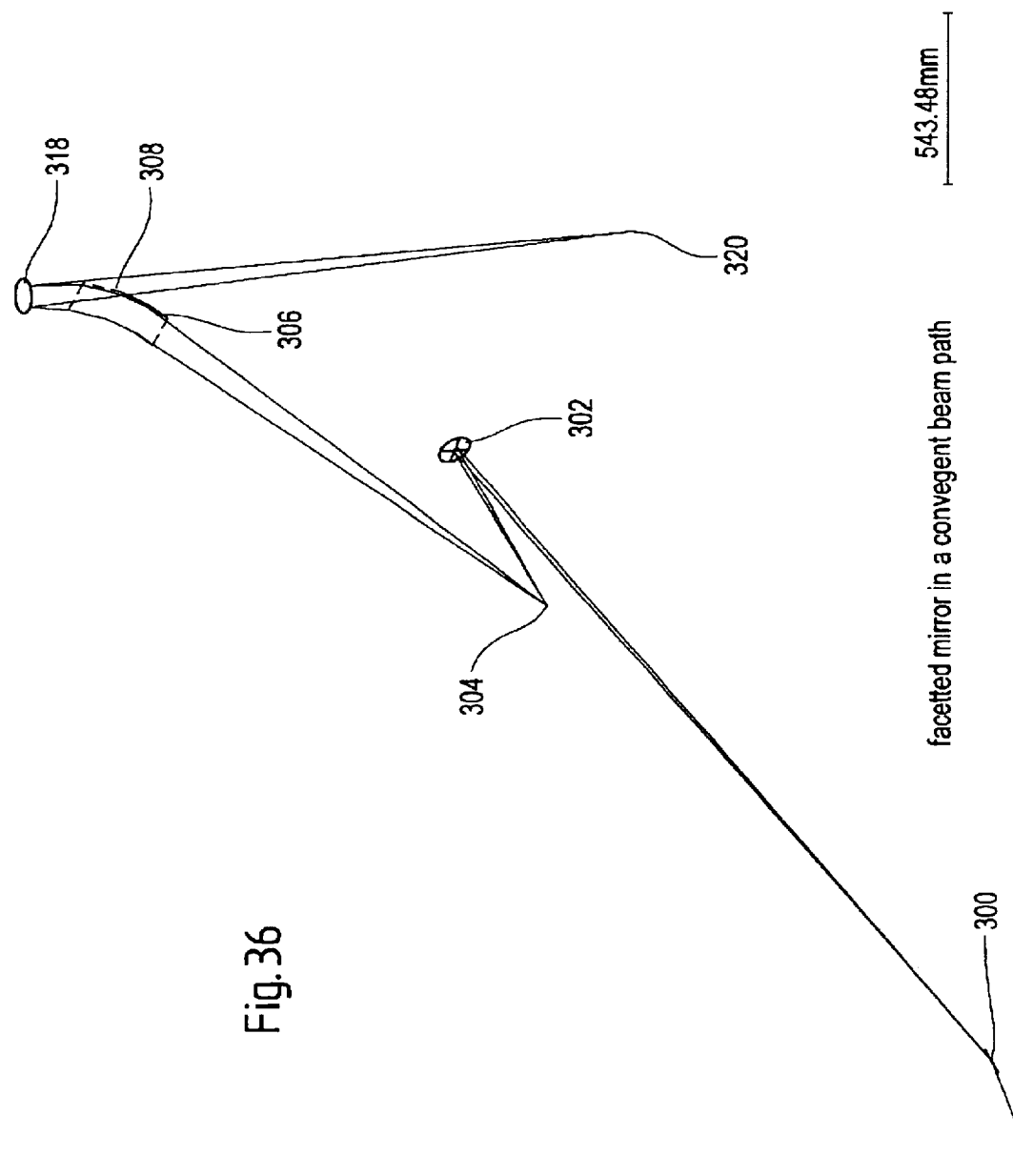

A beam bundle that impinges the central raster element (0,0) is depicted in FIG. 36. The positive optical power of the concave raster element produces the secondary light source in the diaphragm plane. The field mirrors 306, 308 form the arc-shaped field in the image plane 318 and image the secondary light sources situated in the diaphragm plane into the exit pupil 320 of the illumination system.

Figure 37:
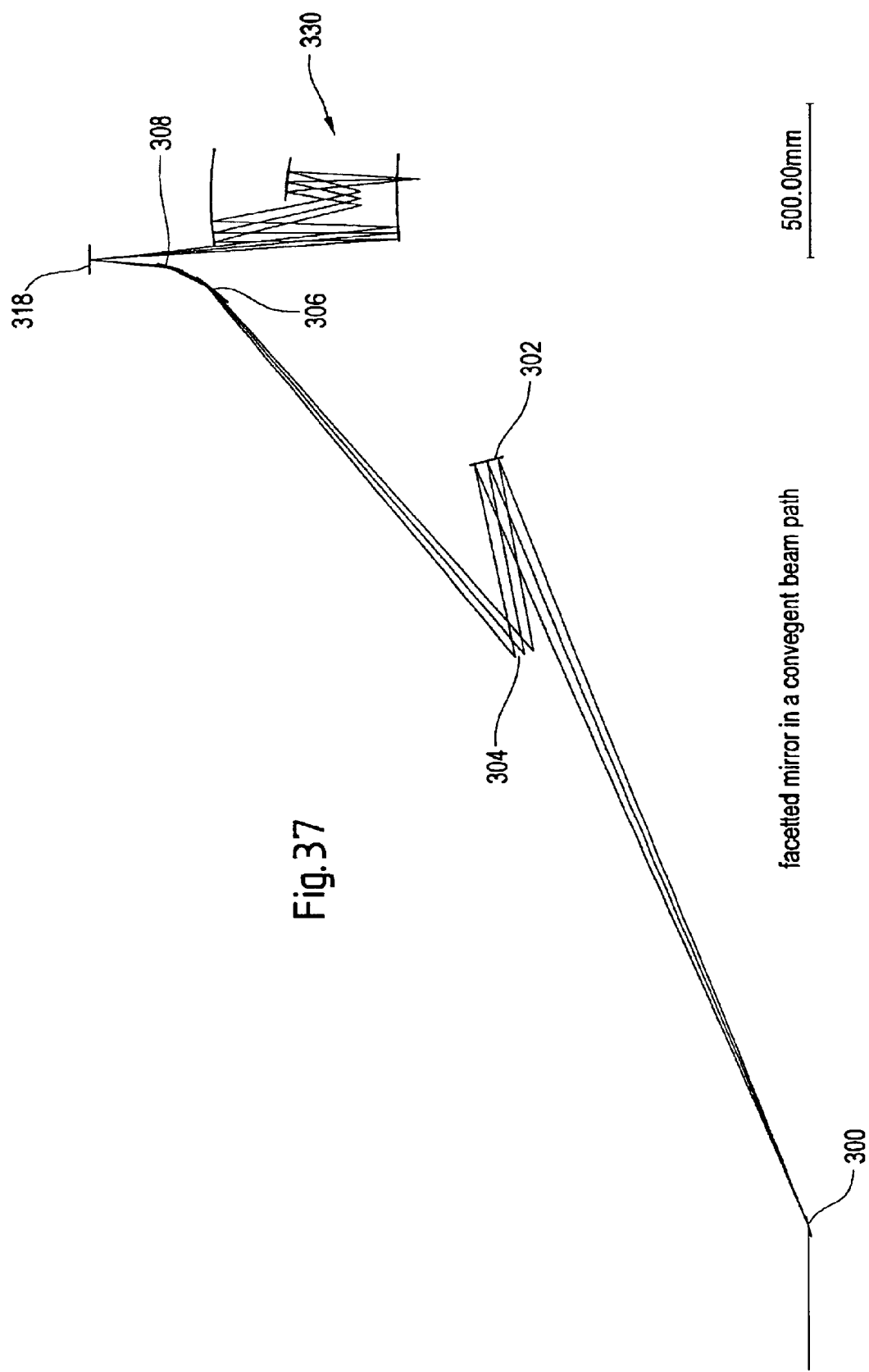

FIG. 37 shows the entire system with objective in the yz-section, comprising: divergent mirror 300, collective mirror 302, facetted mirror 304, field mirrors 306, 308, reticle plane 318 and 4-mirror objective 330. As is apparent the facetted mirror 304 is situated in the convergent beam path, produced by collective mirror 302.

Figure 38:
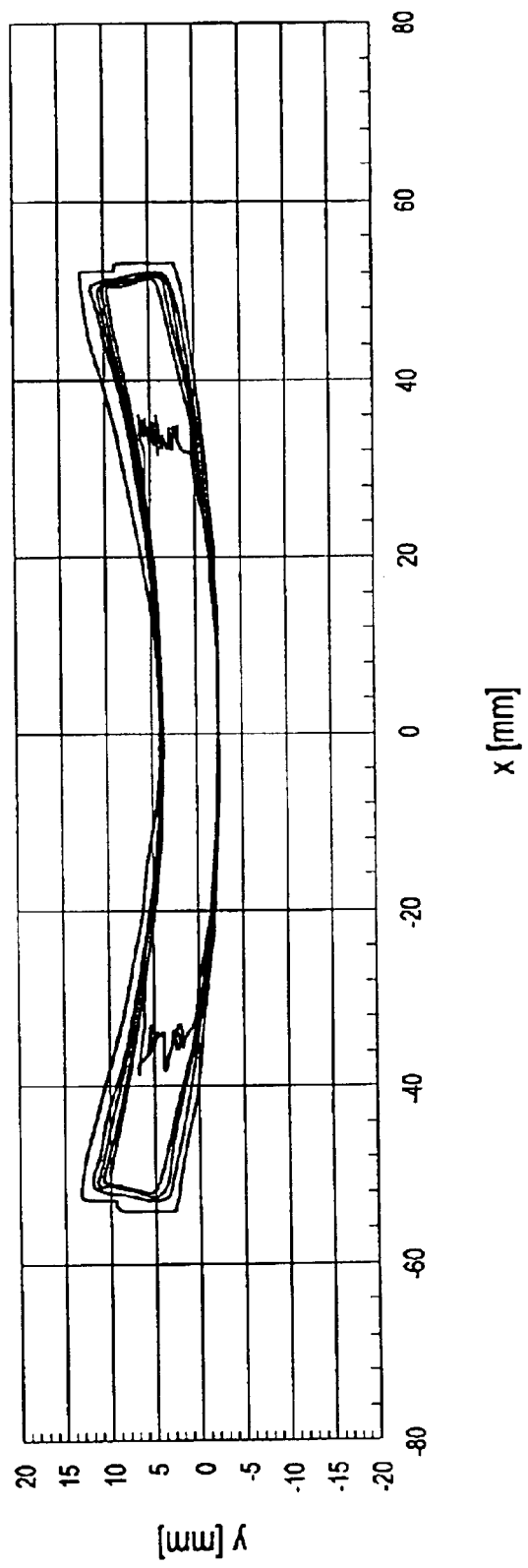
FIGS. 38–41: illumination, intensity distribution, scanning energy and pupil illumination of a system according to FIGS. 34–37.

The illumination of the reticle with the 30° annular field (r=211 mm; −3.0 mm<Δr<+3.0 mm) is shown in FIG. 38 as a contour-line representation. Here, r is the ring radius of the arc-shaped field, wherein a 30° segment from a ring is used. The ring radius r is the distance of the center of the arc-shaped field to the optical axis of the projection objective.

Figure 39:
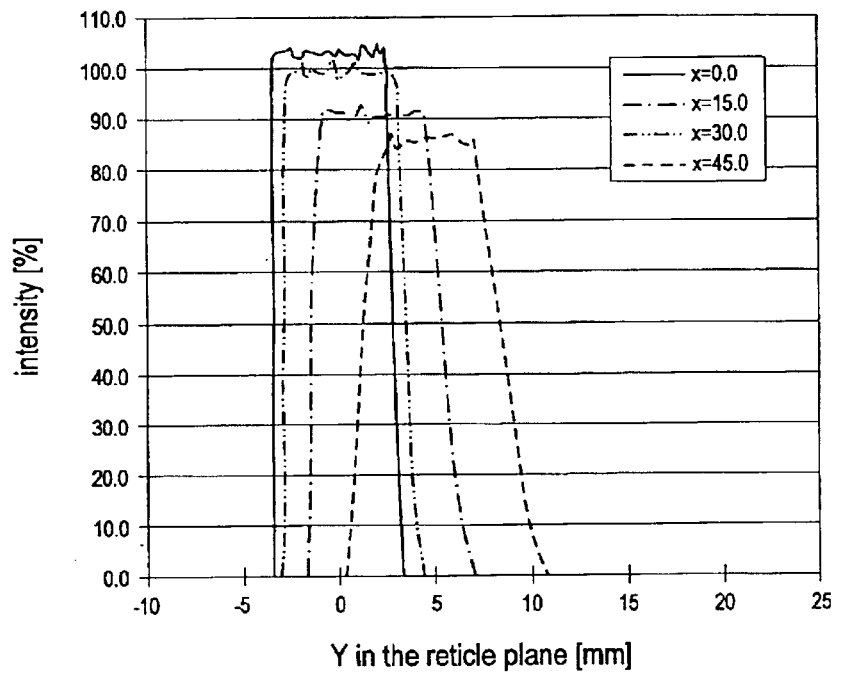

FIG. 39 shows an intensity section parallel to the y-axis at x=0.0, 15 mm, 30 mm, and 45 mm. Since the secondary light sources have only minimal extension, an ideal step-like is formed at least in the center of the field. The width of the intensity profile increases at the edge of the field, due to the radius of the arc-shaped field and the non-optimal superimposition of the images of the first raster elements. The maximum intensity decreases with the broadening of the edges and the increased value of the half-width, so that the scanning energy remains constant.

Figure 40:
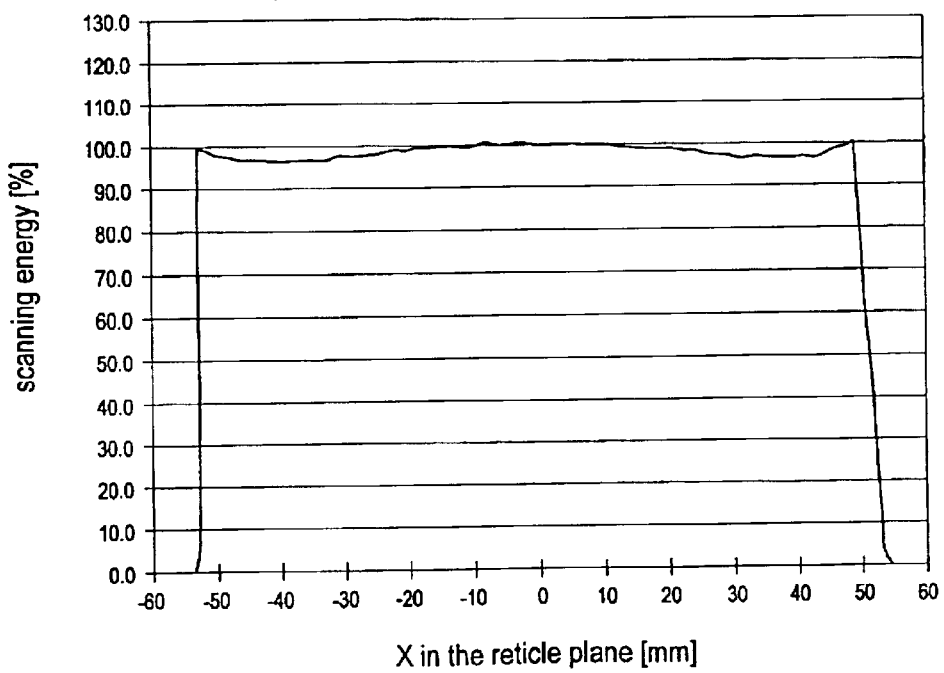

As FIG. 40 shows, the integral scanning energy of the presently described embodiment is nearly homogeneous.

Figure 41:
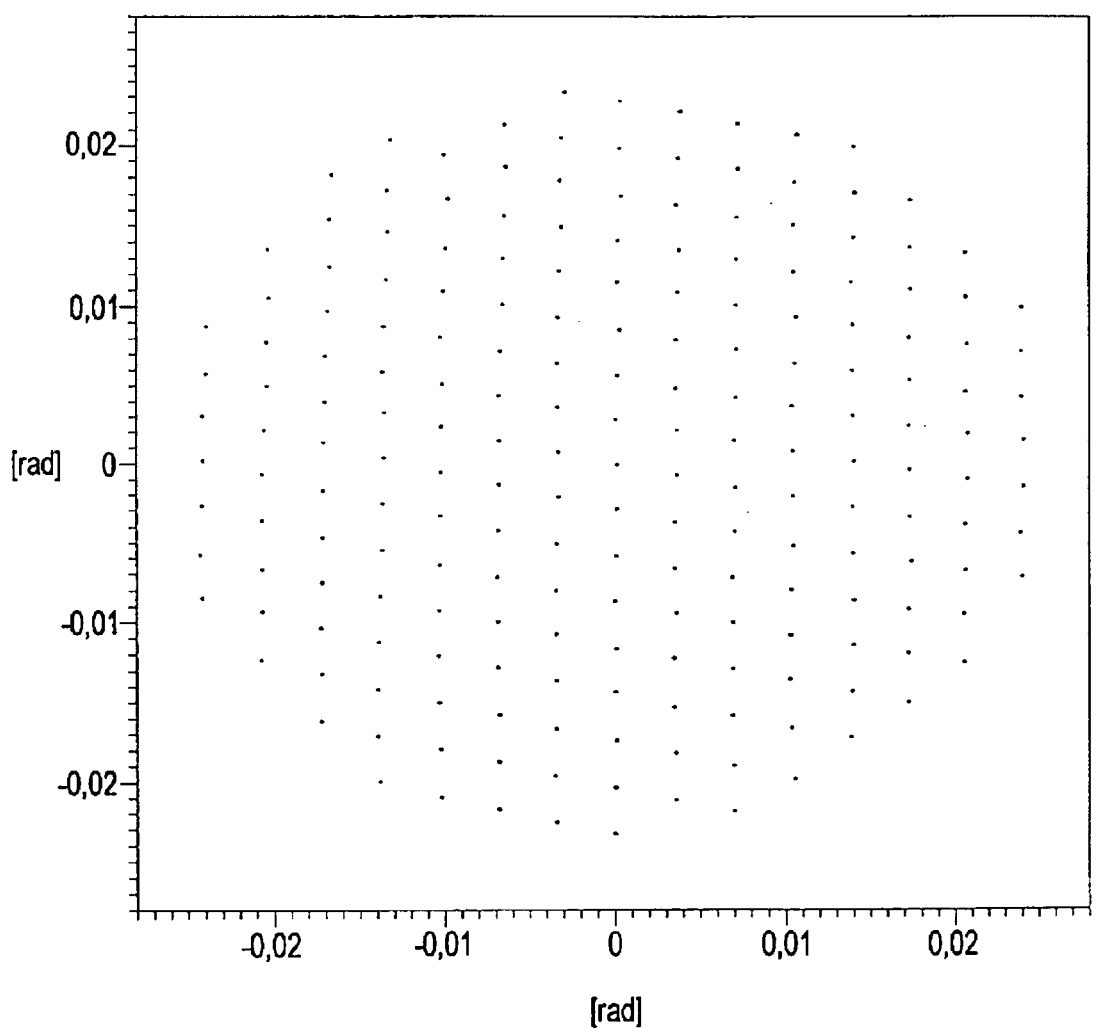

The exit pupil illumination of a field point in the center of the arc-shaped field is shown in FIG. 41.

The following paragraph describes an illumination system with at least one device for producing secondary light sources comprising at least a first mirror, which is divided into raster elements, and one or more first optical elements, which are arranged between the device and an image plane of the illumination system. The first optical elements of the illumination system image the secondary light sources in an exit pupil of the illumination system. The raster elements are tilted to have a converging effect to a diverging light beam, which impinges onto the first mirror. An illumination system with these characteristics is designated as a type C system.

In the embodiment described hereinafter the light source is a undulator light source, without being limited thereto. The undulator light source is taken as before as the point-like light source.

The system according to type C comprises, in a first embodiment according to type C1, a first grazing-incidence collector mirror 400, which deflects radiation downward. Mirror 400 is a divergent mirror having negative optical power, which produces a diverging beam. The diverging beam impinges onto the facetted mirror 402, which reverses the radiation direction again towards the undulator source 200. In order to provide a solution that is free of vignetting, facetted mirror 402, which is divided into a plurality of facets or so called raster elements, introduces a tilt of the optical axis around the y-axis, the so-called β tilt. Therefore, the system axis runs beside the radiation-protection wall. In this application, the optical axis is defined as the connecting lines between the centers of the optical components. The origins of the local coordinate systems of the optical components of the illumination system are located in the centers of the optical components. For mirrors, the origin of the local coordinate system corresponds to the mirror vertex, and for the facetted mirror, to the center of the mirror plate on which the raster elements are mounted.

Figure 42:
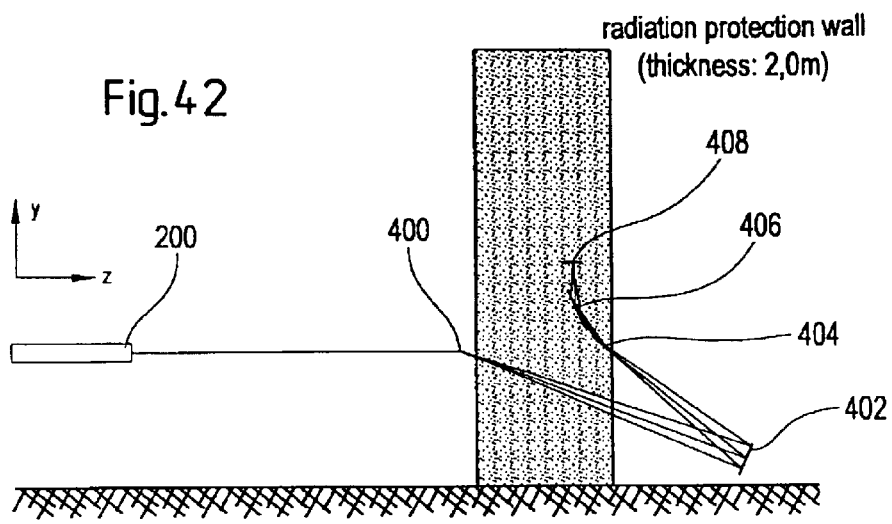
FIGS. 42–43: principal arrangement of a type C1 illumination system in reflective presentation.
Figure 43:
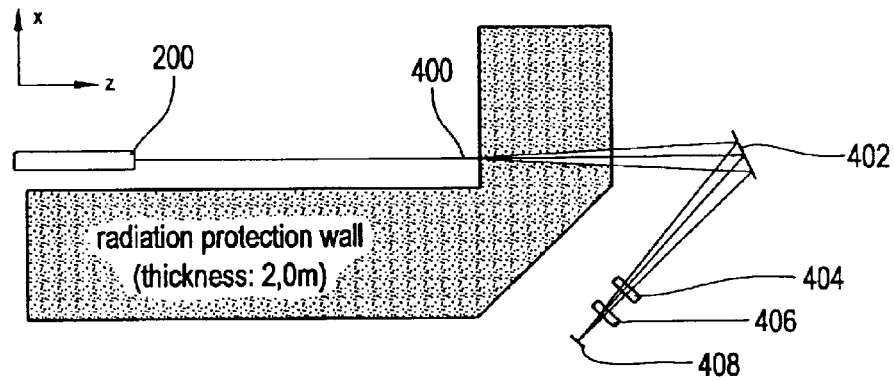
Figure 44:
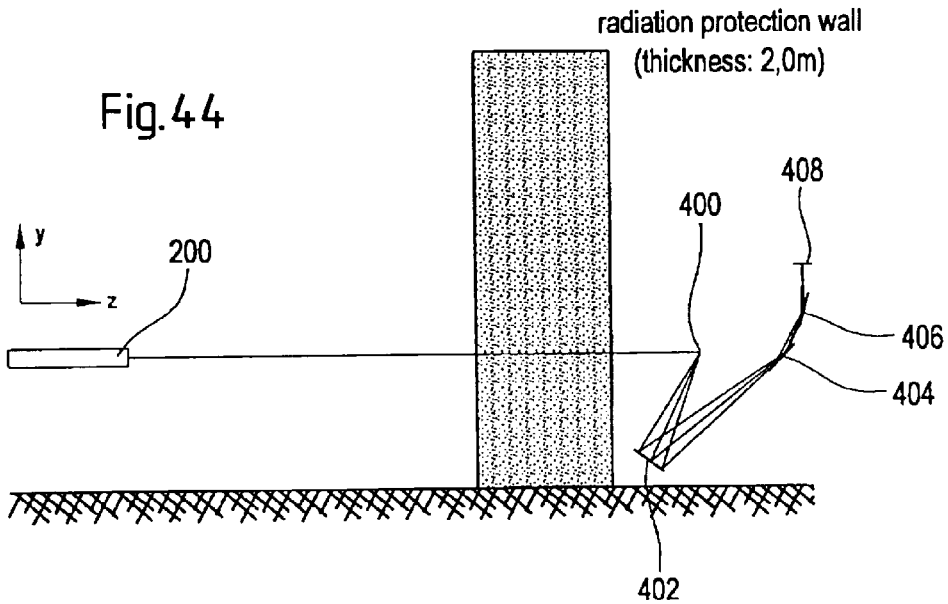
FIG. 44: principal arrangement of a type C2 illumination system in reflective presentation.

FIG. 42 shows the lateral view in the y-z-plane of such a system and FIG. 43 shows the top view in the x-z-plane. The second embodiment, type C2, of a system according to type C is shown in FIG. 44.

In the system according to type C2, the grazing-incidence mirror is replaced by a normal-incidence mirror 400. This has the consequence that the optical axis of the system again runs away from the undulator source after two reflections at mirror 400 and facetted mirror 402. The mirrors must then be tilted only around the x-axis, the so-called α-tilt. A tilt of the optical axis around the y-axis as in the case of type C1 is not necessary. Divergent mirror 400, having negative optical power for producing a diverging beam impinging onto the first mirror 402 with raster elements, is arranged outside the chamber comprising the light source in the case of type C2. Since the source radiation in the case of an undulator source is polarized nearly linearly in the horizontal direction, the optical axis can also be deflected nearby the Brewster angle.

In FIGS. 45 to 54 a system according to type C1 is shown again, in more detail.

The arrangement of the mirrors of this system shown in FIGS. 45 to 54 is given in Table 3.

TABLE 3 arrangement of the mirrors of a type C1-system

| Component | X [mm] | Y [mm] | Z [mm] | α [°] | β [°] | γ [°] | AOI [°] | |
|---|---|---|---|---|---|---|---|---|
| Source | 0.000 | 0.000 | 0.000 | 0.000 | 0.000 | 0.000 | 0.000 | — |
| Divergent mirror | 0.000 | 0.000 | 5000.000 | −80.000 | 0.000 | 0.000 | 80.000 | g.i. |
| Mirror with field raster elements | 0.000 | −1026.060 | 7819.078 | 31.039 | 9.462 | 179.084 | 14.501 | n.i. |
| Diaphragm | −63.666 | −897.503 | 7679.723 | 222.692 | −18.562 | 16.366 | 0.000 | — |
| Field mirror 1 | −493.075 | −30.412 | 6739.809 | 138.466 | −18.880 | −15.994 | 78.858 | g.i. |
| Field mirror 2 | −531.728 | 146.641 | 6655.203 | −18.117 | 203.471 | −7.425 | 78.857 | g.i. |
| Reticle | −539.593 | 345.744 | 6637.988 | 270.000 | 0.000 | 24.554 | 5.430 | n.i. |
| EP objective | −627.274 | −1873.997 | 6446.069 | 90.000 | 0.000 | 155.446 | 0.000 | — | wherein the abbreviations denote:

X, Y, Z: origin of the coordinates of the components.

α,β,γ: rotation angle around the x-, y-, and z-axis. The angles are referred to the coordinate system of the source AOI: angle of incidence of the optical axis at the components g.i./n.i.: grazing incidence/normal incidence In this application normal incidence mirrors are mirrors with angles of incidence of the rays impinging the mirror surface smaller than 30° relative to the surface normal, and grazing incidence mirrors are mirrors with angles of incidence of rays impinging the mirror surface or φ>60° relative to the surface normal.

The z-axis of the image plane in which the reticle is situated is at 90° relative to the z-axis of the source coordinate system.

The z-distance between source and divergent mirror 400 amounts to 5000 mm. The facetted mirror 402 is rotated around the x and y axes such that the projection objective would not cross the illumination beam path.

The facetted mirror 402 comprising a plurality of facets or so called raster elements lies −1026.1 mm in y-direction beneath the light source 200, and the reticle plane lies 345.79 mm in y-direction above the source.

The design of type C1 given as an example will now be described in more detail on the basis of the figures.

Figure 45:
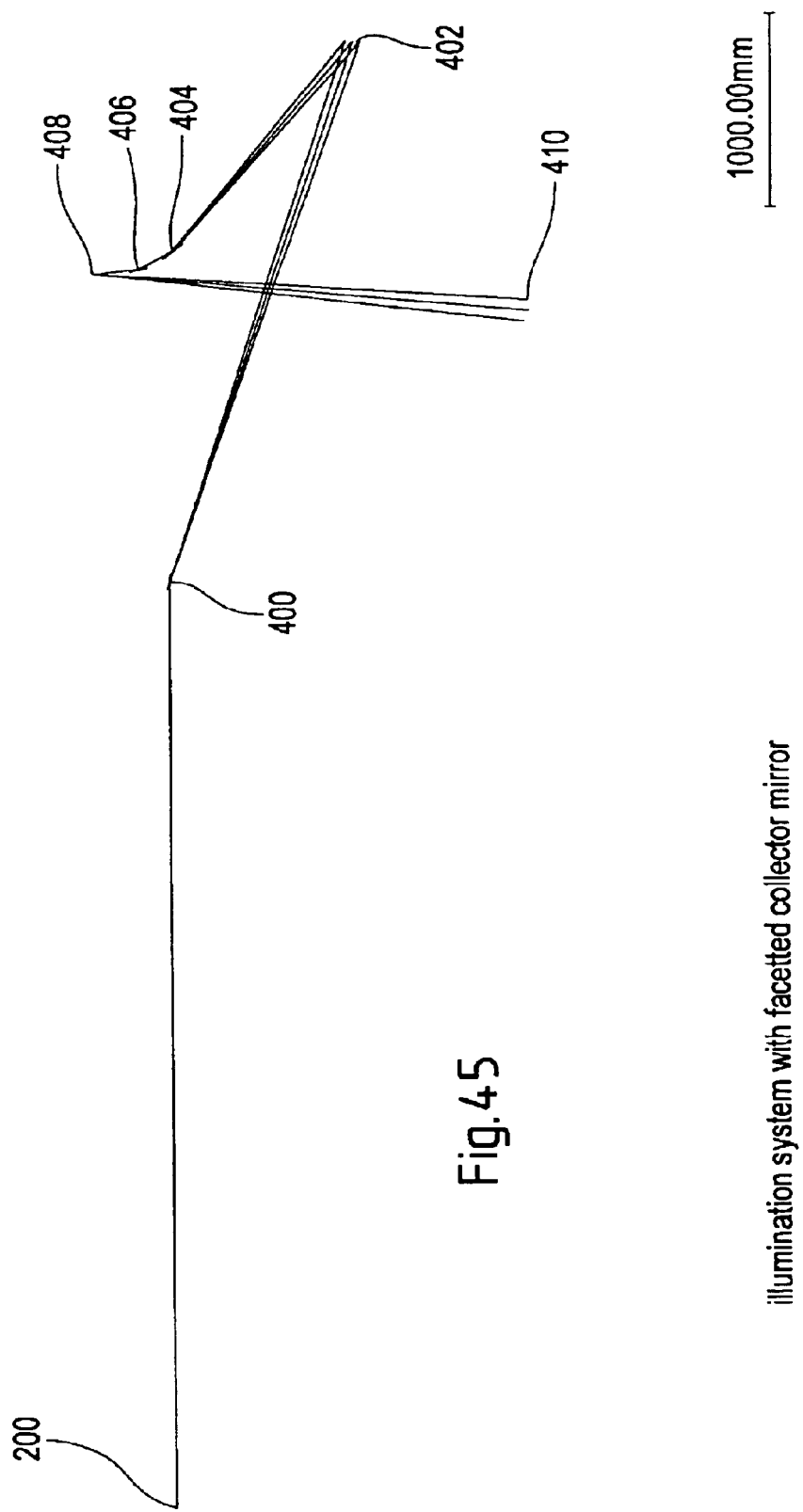
FIGS. 45–50: a configuration of a type C1 illumination system.

FIG. 45 shows the entire illumination system from the light source 200 up to the entrance pupil of the objective, which corresponds to the exit pupil 410 of the illumination system in the y-z section. The illumination system comprises a light source 200, a divergent mirror 400 having negative optical power, a facetted mirror 402 with a convergent effect to the divergent light beam impinging the facetted mirror, field mirrors 404, 406 and an image plane 408. Furthermore, the exit pupil 410, which corresponds to the entrance pupil of the objective, is shown. The center rays are shown for the central field raster element (0,0) and the two field raster elements on the field raster element plate with the greatest distance to central field raster element. According to the invention, by tilting each individual field raster element with respect to the surface of the facetted mirror 402 a convergent effect onto the divergent light beam formed, for example, by divergent mirror 400 impinging the facetted mirror 402, could be achieved. Due to the individual tilts the center rays of the different field raster elements of the facetted mirror 402 intersect each other in the image plane 408, where the reticle is situated. Thus, the images of the individual field raster elements are superimposed, at least partially, in the image plane. The exit pupil 410, which corresponds to the entrance pupil of the objective, is homogeneously illuminated.

Figure 46:
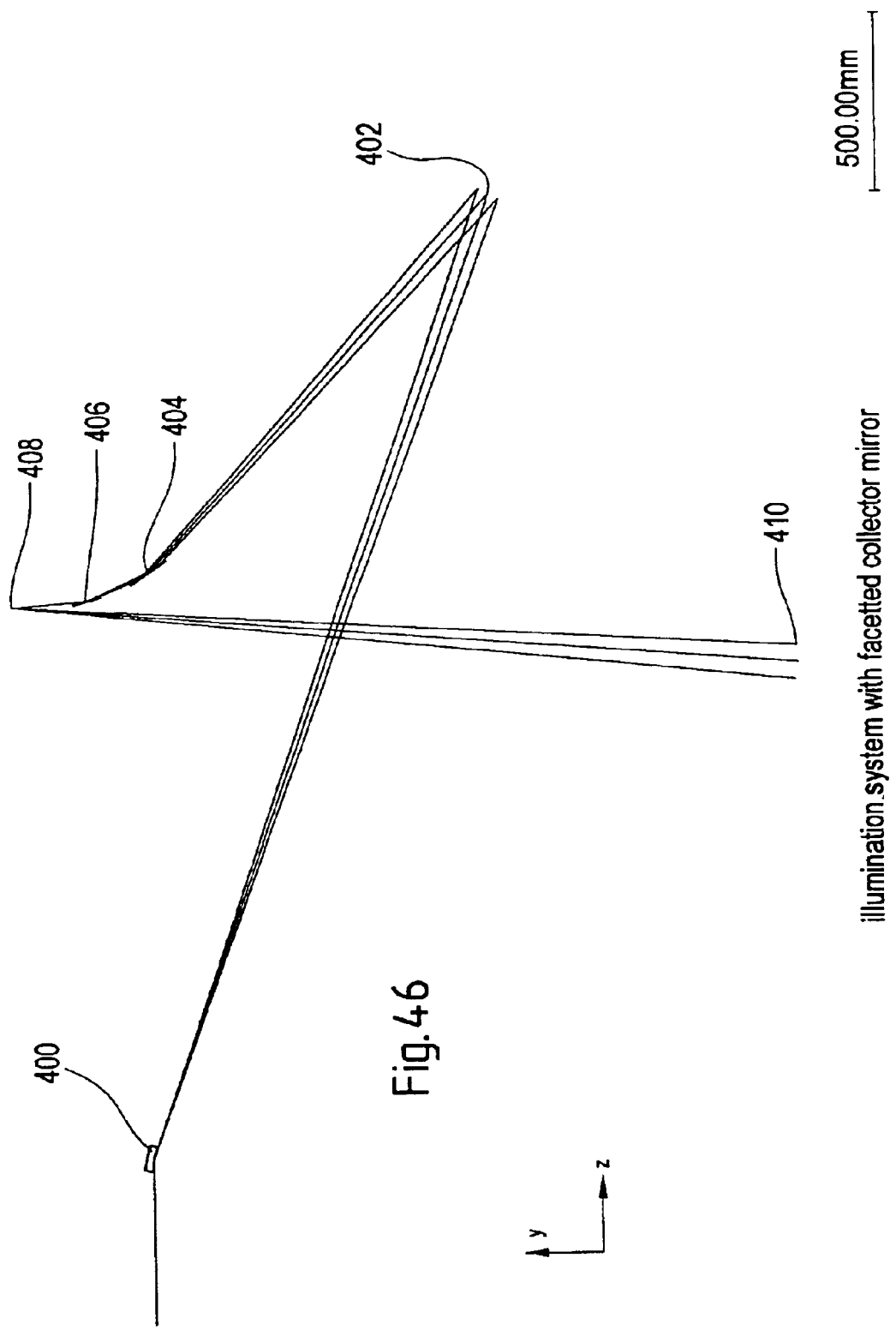

FIG. 46 shows a part of the illumination system beginning with the divergent mirror 400 in the y-z section. The depicted center rays are traveling divergent to the optical axis in front of the facetted mirror 402. They impinge at the facetted mirror 402 at the centers of the central field raster element and the two field raster elements with the greatest distance to the central field raster element. Due to the tilted field raster elements, the center rays are traveling convergent to the optical axis after reflection at the facetted mirror 402. They are deflected such that they intersect each other in the image plane 408. Therefore, the images of the raster elements are superimposed, at least partially, in the image plane 408.

Figure 47:
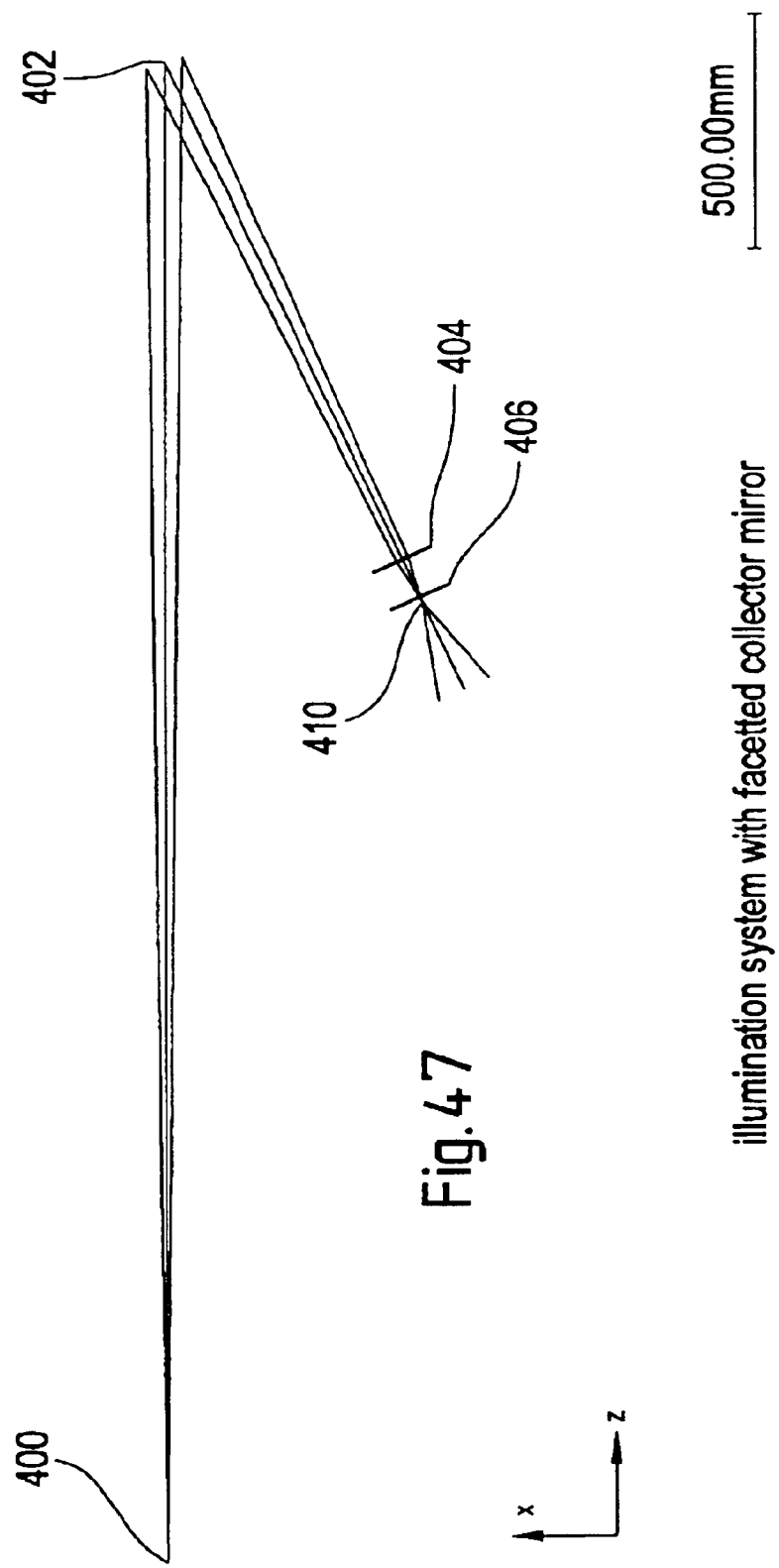

FIG. 47 shows the same part of the illumination system as FIG. 46, but in an x-z-section beginning with divergent mirror 400. The facetted mirror 402 also tilts the optical axis around the y-axis. Therefore, the objective can be situated away from the radiation protection wall.

Figure 48:
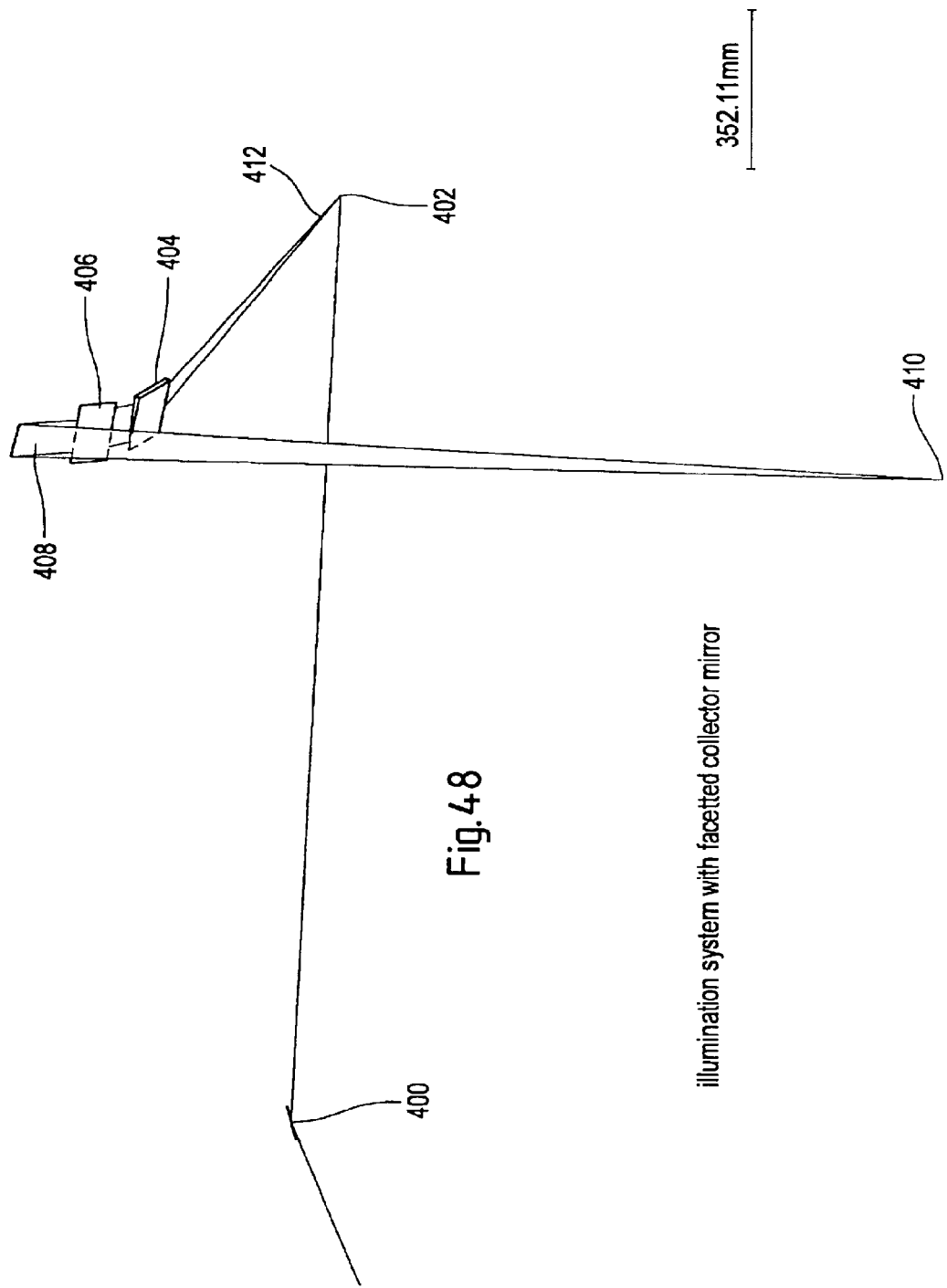

A beam bundle, which impinges on central raster element (0,0) of the facetted mirror is depicted in FIG. 48. The raster elements themselves have positive optical power to produce secondary light sources in the diaphragm plane. Field mirrors 404, 406 form the annular or arc-shaped field in the image plane and image the secondary light source 412 in the entrance pupil 410.

Figure 49:
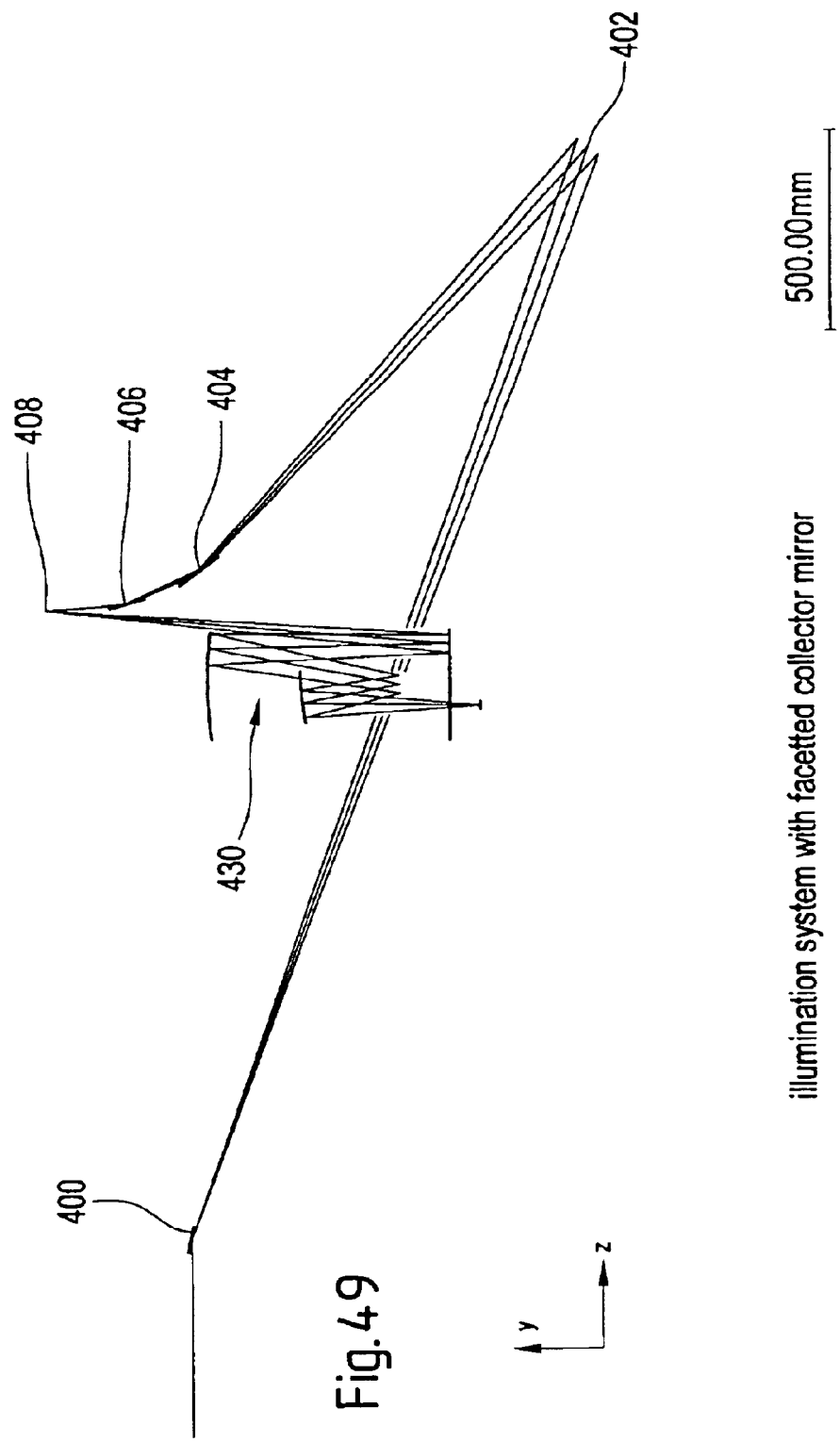

FIG. 49 shows a projection exposure apparatus comprising an illumination system and a 4-mirror projection objective 430 in the y-z section. The illumination system comprises a divergent mirror 400 producing a divergent beam bundle impinging onto a facetted mirror 402 comprising a plurality of raster elements. The facetted mirror 402 has a convergent effect on the divergent beam bundle. Furthermore, the illumination system comprises field mirrors 404, 406, reticle plane 408 and 4-mirror objective 430. The beams running into the objective are separated from the illumination system.

Figure 50:
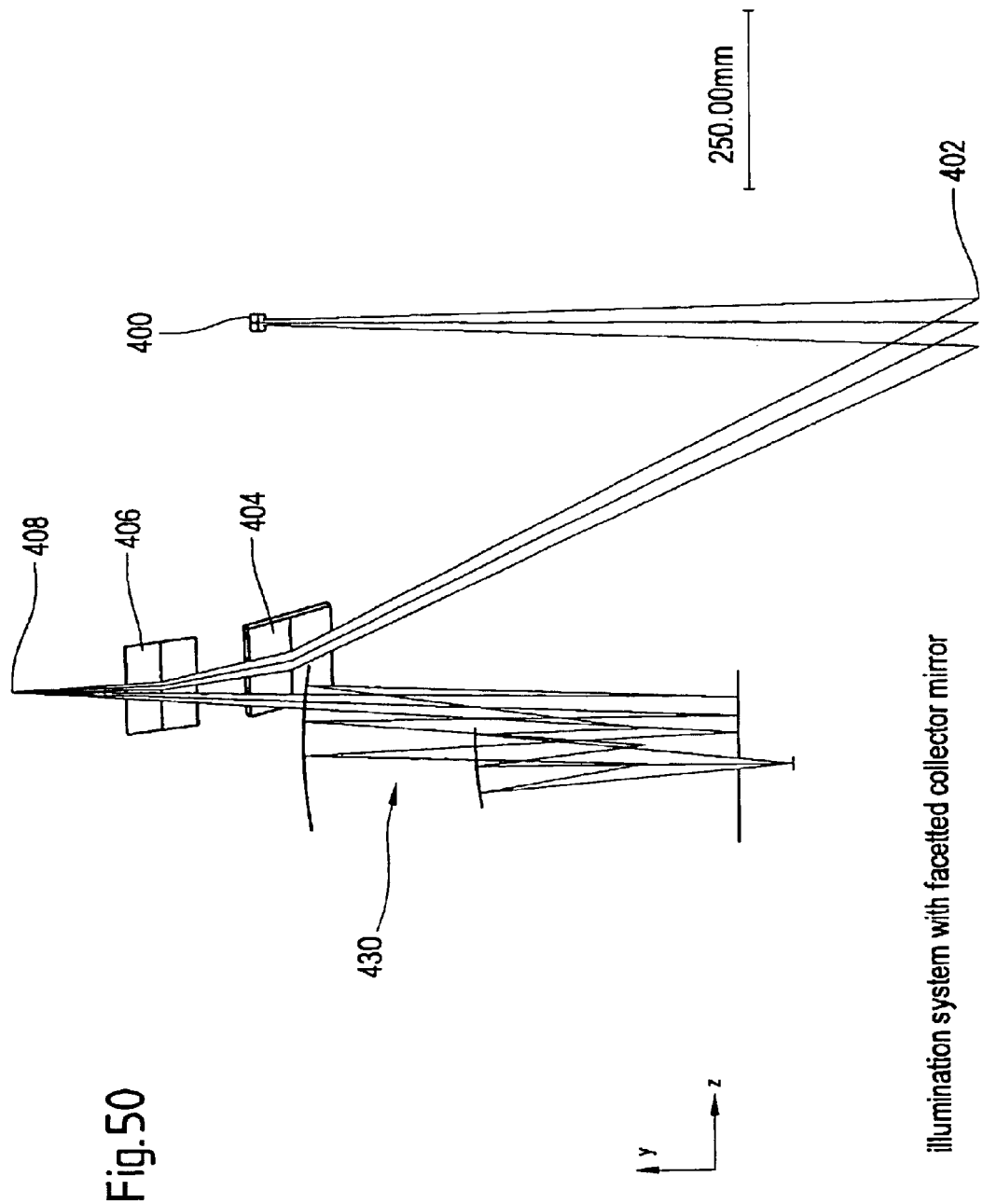

A part of the projection exposure apparatus is shown in the y-z section in FIG. 50. In this view, the separation of the projection beam path and the illumination beam path is clearly seen.

Figure 51:
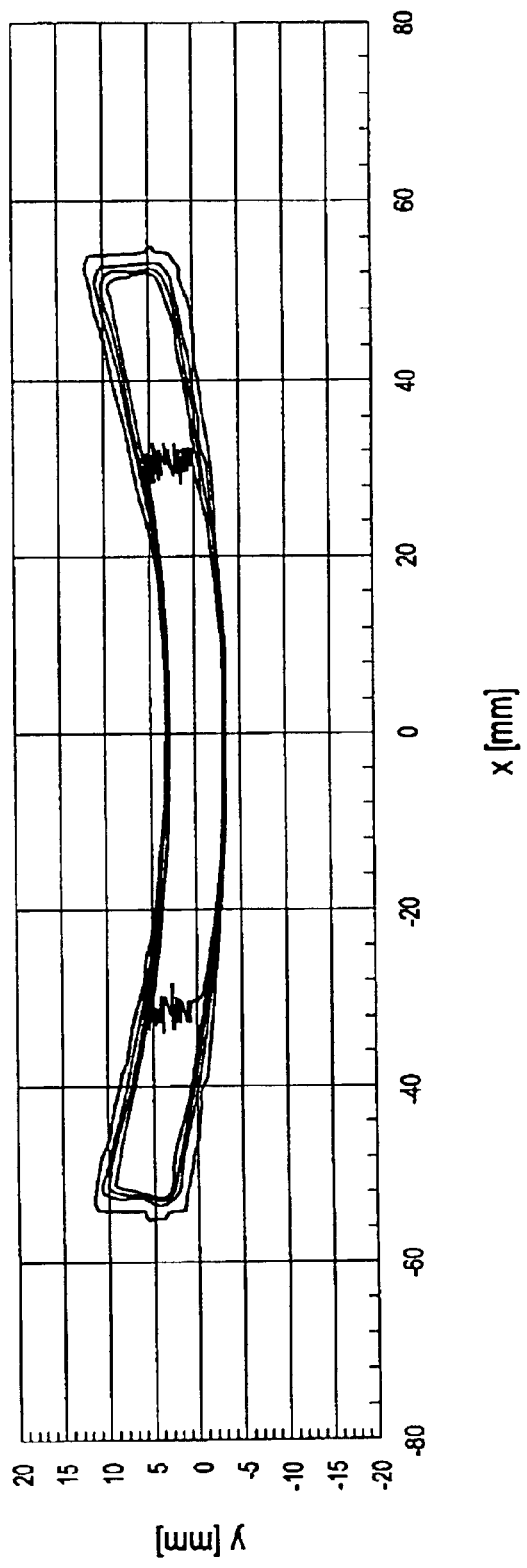
FIGS. 51–54: illumination, intensity distribution, scanning energy and pupil illumination of a system according to FIGS. 45 to 50.

FIG. 51 shows the illumination of the reticle with a 30° annular or arc-shaped field (r=211 mm; −3. mm<Δr<+3.0 mm) in contour-line representation. The different contour lines refer to lines with the same intensity in the image plane. As is apparent from this figure, the images of different field raster elements are superimposed, at least partially, in the image plane.

Figure 52:
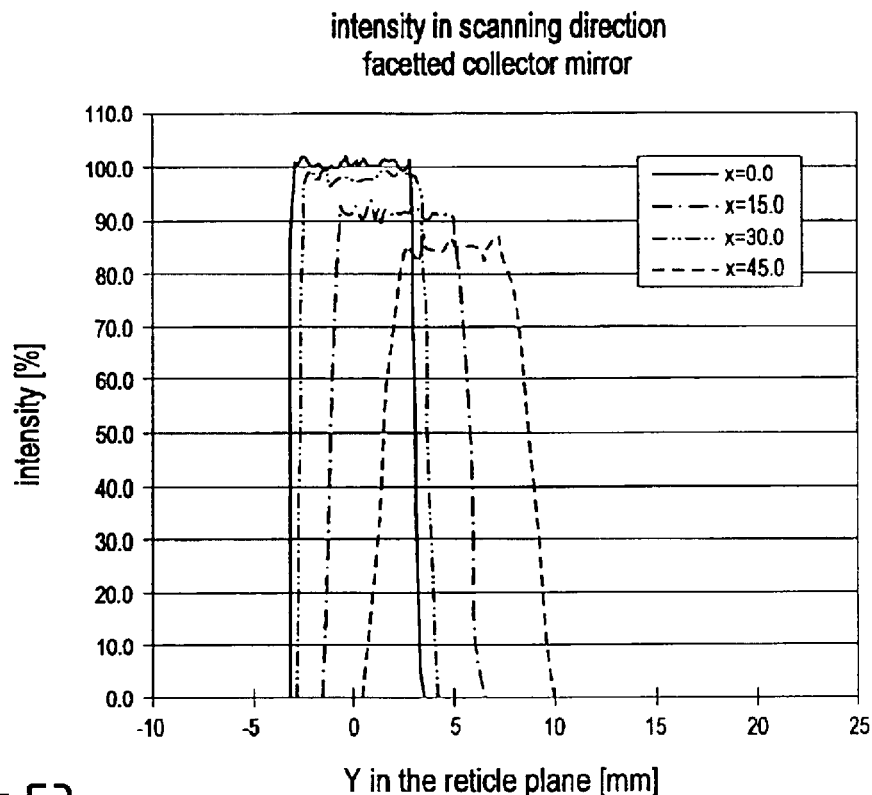

FIG. 52 shows an intensity section of the illumination in the image plane parallel to the y-axis for x=0.0, 15 mm, 30 mm, and 45 mm of the C1-type system.

Figure 53:
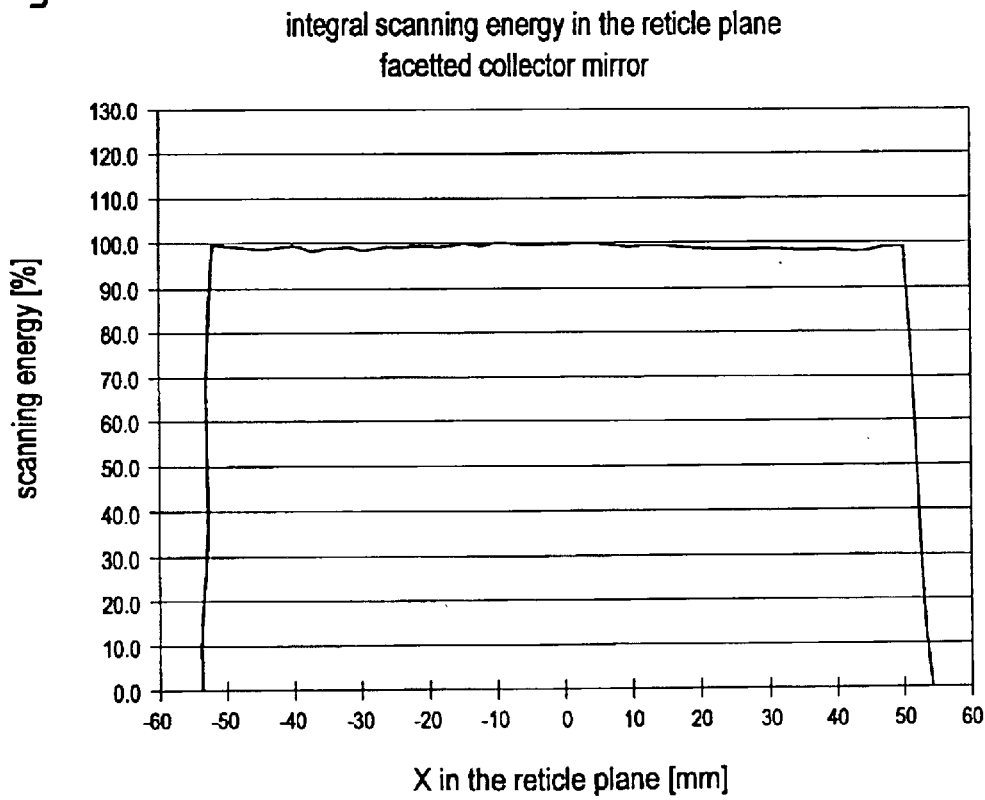

FIG. 53 shows the integral scanning energy of the presently described embodiment, which is almost homogeneous.

Figure 54:
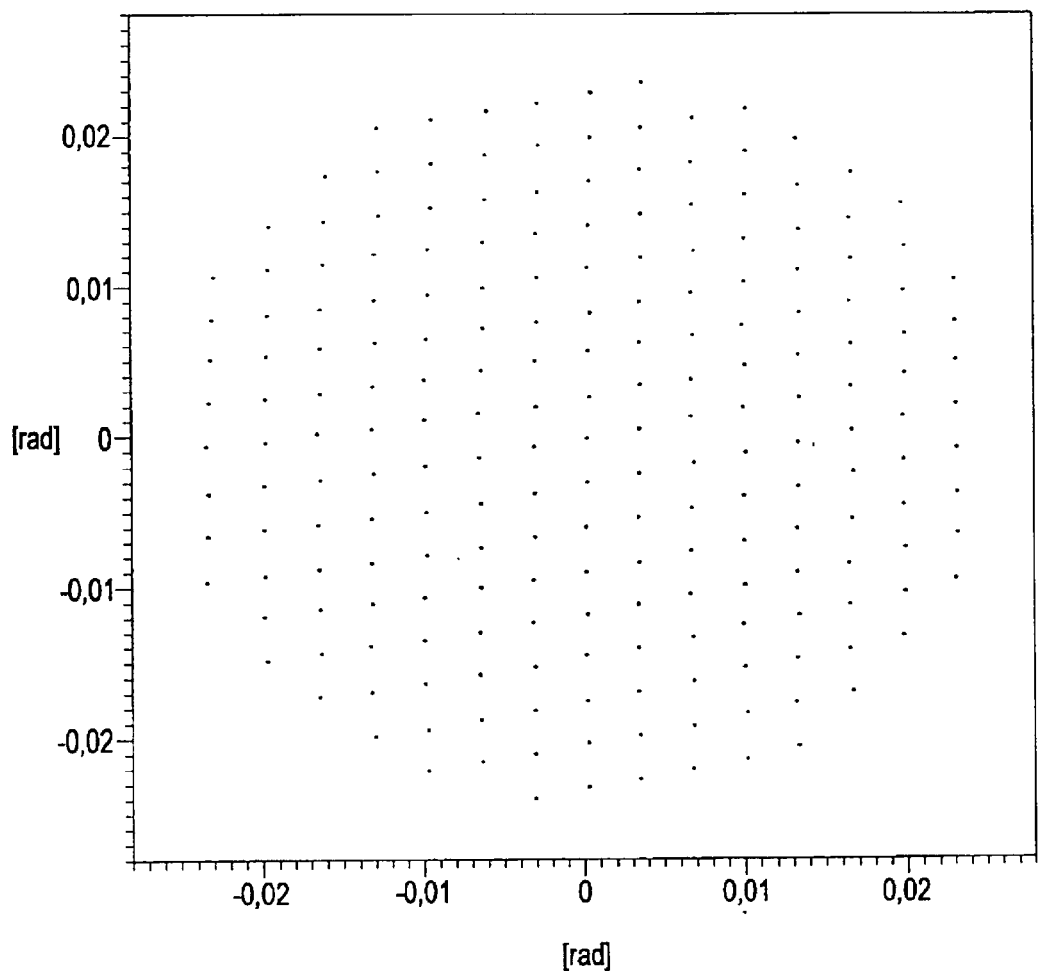

The illumination of the exit pupil of a type C1-system for the center field raster element is shown in FIG. 54. Partial pupils, which are the images of the secondary light sources in the exit pupil, correspond to the raster element distribution on the first mirror. The maximal numerical aperture amounts to $NA_{ret}$=0.025. The numerical aperture of a partial pupil is negligibly small ($NA_{partial\ pupil}$=2E-6) corresponding to the small Entendu of the undulator source.

However, a complete filling of the pupil is achieved, when seen as an integral, due to the uniform distribution of the secondary light sources.

By wobbling one of the field mirrors, or by dynamically deforming the surface of one of the field mirrors, the grid of the partial pupils in the exit pupil can be periodically shifted to get a complete filing of the pupil in a time average.

It is not necessary that the diaphragm plane is accessible, so one may also operate with a virtual diaphragm plane.

For type C-systems, the raster elements of the facetted mirror must not have a positive optical power. They might be, for example, planar raster elements, which are easy to manufacture. In such a case, which is shown in FIG. 55, the divergent mirror 1002 having negative optical power produces a virtual secondary light source 1000, as shown in FIG. 55A. The divergent beam impinging on the facetted mirror is deflected in the embodiment shown by tilted planar raster elements such that the center rays associated with each raster element intersect each other in the image plane, where the reticle is situated on the optical axis. In a refractive embodiment, as shown in FIG. 55B, the tilted planar raster elements correspond to a plurality of prisms. In such an arrangement, a plurality of secondary light sources 1002 is produced in a virtual diaphragm plane.

The following formulas describe relationship of the system parameters according to FIGS. 55A and B:

$$NA_{Ret} = \frac{\frac{DU_{BL}}{2}}{d_4} \quad \Rightarrow DU_{BL} = 2 \cdot d_4 \cdot NA_{Ret}$$

$$\frac{DU_{BL}}{x_{Wabe}} \cdot \frac{d_4 - |d_3|}{d_4} = 4.0 \quad \Rightarrow x_{Wabe} = \frac{DU_{BL}}{4.0} \cdot \frac{d_4}{d_4 - |d_3|}$$

$$\beta_{Wabe} = \frac{x_{Feld}}{x_{Wabe}} = \frac{d_4}{|d_3|} \quad \Rightarrow \beta_{Wabe} = \frac{x_{Feld}}{x_{Wabe}}$$

$$\Rightarrow |d_3| = \frac{d_4}{\beta_{Wabe}}$$

wherein:
DU=diameter
BL=diaphragm
Wabe=raster element
Feld=field
wherein:
$d_4$: measurement for the structural length
$NA_{ret}$: aperture in the reticle plane.

The number of raster elements in a raster element row corresponds to four (4). This provides for the number of secondary light sources, the uniformity of the field, and the uniform illumination of the pupil.

$x_{Feld}$: x-extension of the field
$x_{Wabe}$: x-extension of the raster element
$d_1$: distance between the primary light source and the divergent mirror
$d_2$: distance between the divergent mirror and the facetted mirror
$d_3$: distance between the virtual secondary light sources or the virtual diaphragm plane and the facetted mirror
$d_4$: distance between the virtual diaphragm plane and the image plane It is clear from the schematic representation according to FIGS. 55A–B that the distances $d_2$ and $d_3$ are approximately of equal magnitude for an undulator source with $NA_{source}=0.001$. Together with a structural length that can be realized, this will require, in practical terms, a normal-incidence collector mirror.

The embodiment of FIGS. 55A and 55B is also an embodiment with a facetted mirror having a converging effect on a diverging beam bundle impinging this facetted mirror according to the invention. Advantageously, the raster elements in this embodiment can be planar.

In order to smear the sharp intensity peaks as shown, for example, in FIG. 54, in the pupil and to effectively increase Entendu, the last field mirror can be designed as a moving mirror, a so-called wobbling field mirror, in all forms of embodiment of the invention. The movement of a wobbling field mirror primarily changes the positions of the partial pupils in the exit pupil and therefore causes a complete filling of the exit pupil in time average and has little influence on the field position since the wobbling mirror is arranged close to the image plane.

In addition to a movement of the entire mirror, a periodic surface change of the last mirror is also conceivable in order to achieve this smearing of the sharp intensity peaks in the pupil.

In order to reduce the raster element aspect ratio, the use of astigmatic facets is possible. The diaphragm plane is then split into sagittal and tangential diaphragm planes. The aspherical field mirrors image these two planes in the entrance pupil of the objective.

The illumination distribution in the reticle plane can be influenced by the design of the field forming optical components, e.g., the filed mirrors or the field lenses. For example, the field forming optical components can be designed to achieve a uniform scanning energy.

For the control of the scanning uniformity, in another configuration of the invention, one of the two field mirrors can be configured as an active mirror.

The azimuthal distortion can be controlled by several actuator rows, which are arranged in the x-direction.

Figure 56:
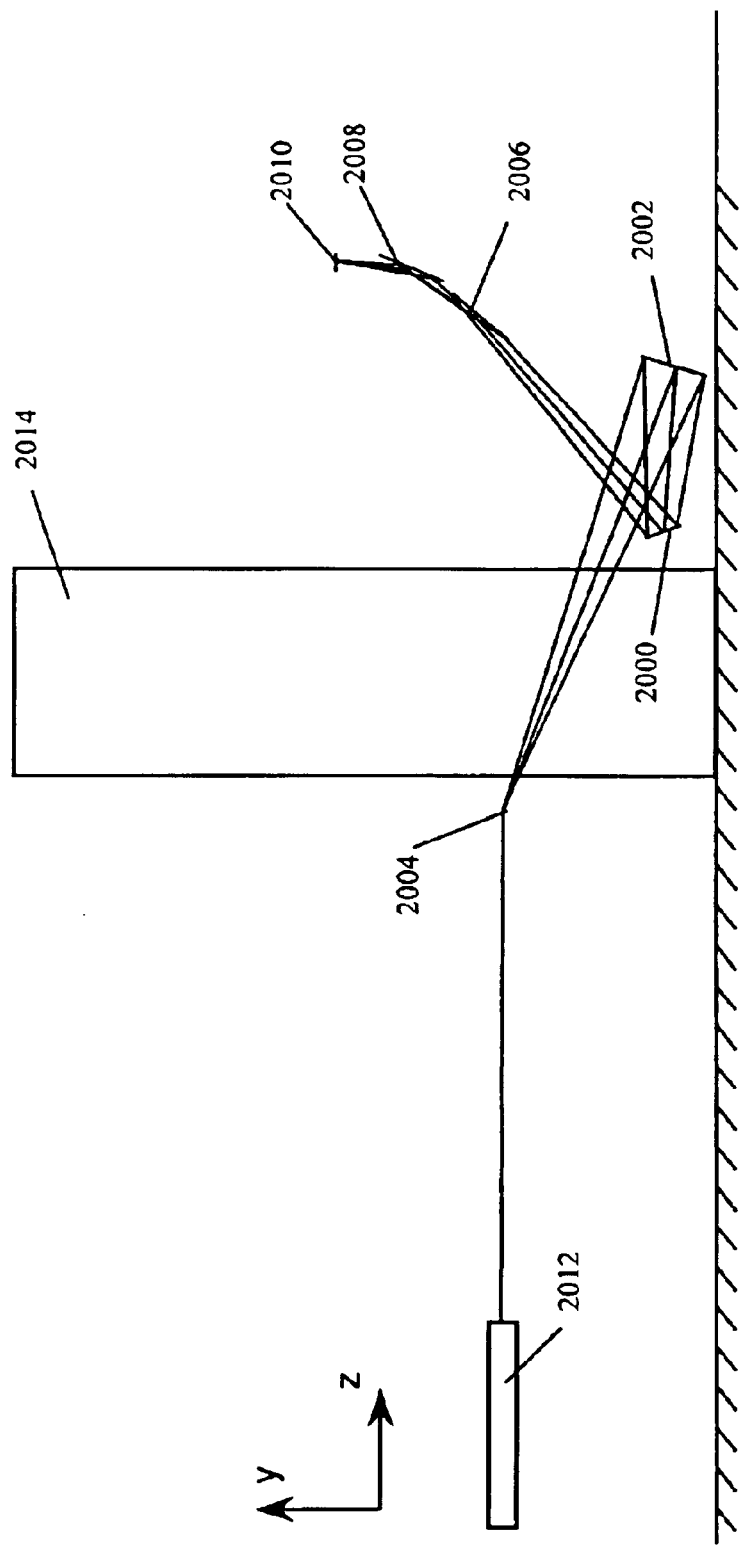
FIG. 56: a type C1-system in reflective representation with a first facetted field mirror having field raster elements and a second facetted pupil mirror having pupil raster elements, configured with a folded beam path.
Figure 57:
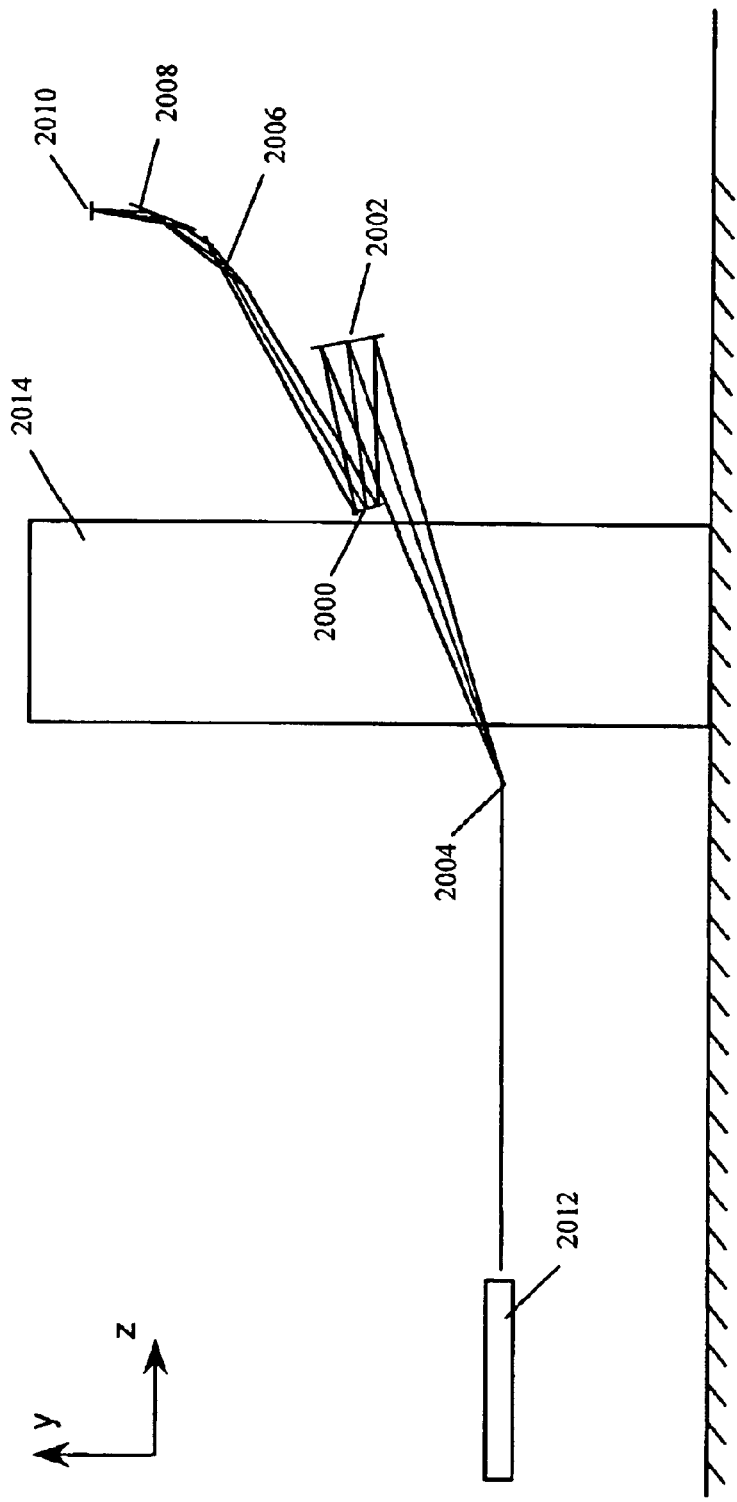
FIG. 57: a type C1-system in reflective representation with a first facetted field mirror having field raster elements and a second facetted pupil mirror having pupil raster elements.
Figure 58:
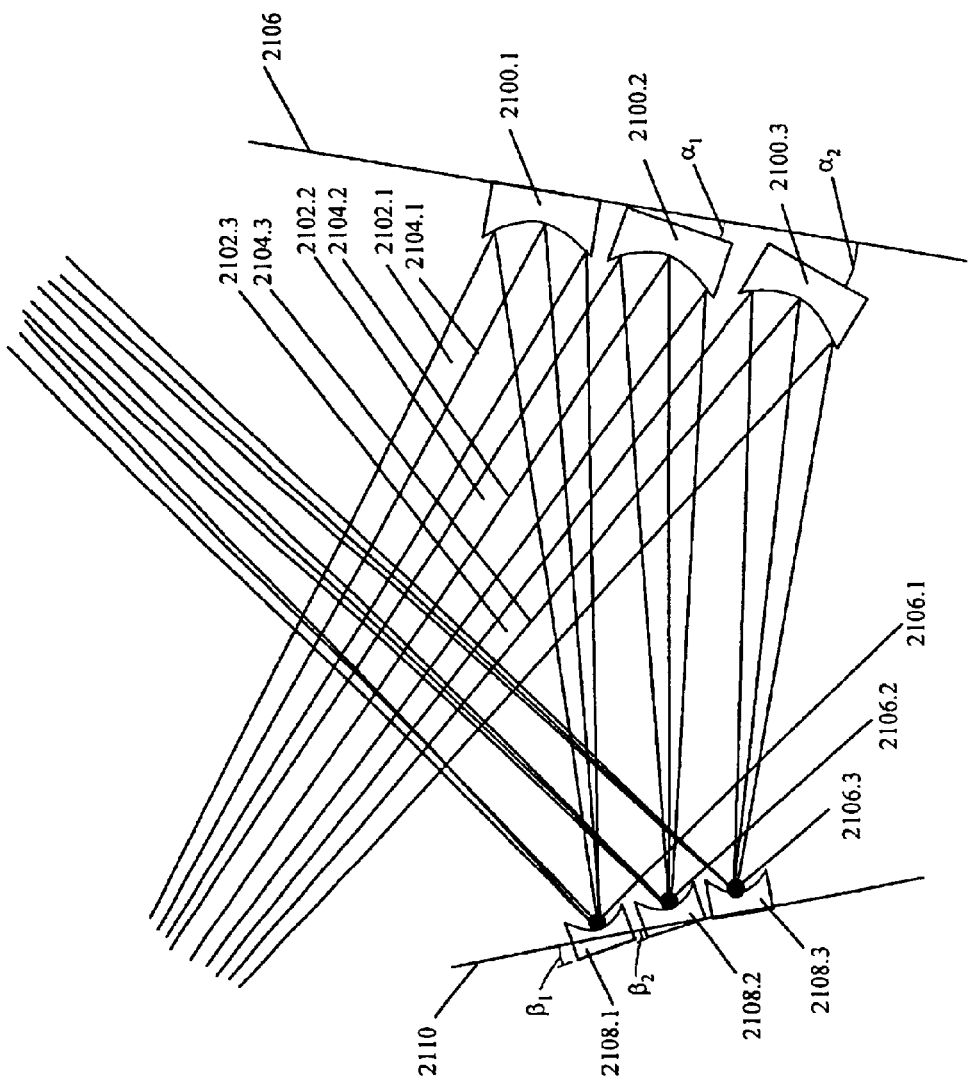
FIG. 58: a detailed view of a first facetted mirror having field raster elements and a second facetted mirror with pupil raster elements.

FIGS. 56 to 58 show an enhancement of a type C1-illumination system, an example of which is shown in FIGS. 42 and 43. The enhanced system includes a light source 2012, a divergent mirror 2004, a field raster element plate 2002, a pupil raster element plate 2000, field mirrors 2006 and 2008, and an image plane 2010. The system also includes a radiation protection wall 2014.

Light source 2012 is preferably an undulator light source, as described herein for other embodiments, but it is not limited thereto. Light source 2012 emits light that impinges divergent mirror 2004.

Divergent mirror 2004 receives the light from light source 2012 and produces a divergent beam. The divergent beam travels in a light path from divergent mirror 2004 to field raster element plate 2002.

Field raster element plate 2002, also known as a facetted mirror, includes a plurality of field raster elements. It receives the light from divergent mirror 2004 and directs the light to pupil raster element plate 2000.

Pupil raster element plate 2000, also known as a facetted mirror, includes a plurality of pupil raster elements. The pupil raster elements are located at or nearby a site of secondary light sources. Pupil raster element plate 2000 receives the light from field raster element plate 2002 and directs it to field mirror 2006.

The light travels from pupil raster element plate 2000 to field mirror 2006, and thereafter to field mirror 2008. Field mirror 2008 then directs the light to image plane 2010. A reticle (not shown) is situated in image plane 2010.

If the illumination system of FIG. 56 is represented in only two-dimensions, e.g., the paper plane of FIG. 56, then the light path from divergent mirror 2004 to field raster element plate 2002 appears to cross the light path from pupil raster element plate 2000 to field mirror 2006. This crossing of the light path is also known as X-folding and provides for a very compact-sized illumination system.

In contrast, FIG. 57 shows an Illumination system of type C1, in which the light path from divergent mirror 2004 to field raster element plate 2002 does not cross the light path from pupil raster element plate 2000 to field mirror 2006.

FIG. 58 shows a detailed view of a field raster element plate and a pupil raster element plate in a system such as that illustrated in FIG. 56. As mentioned earlier, raster element plates are also known as facetted mirrors.

The field raster element plate includes three field raster elements 2100.1, 2100.2, 2100.3. Each field raster element 2100.1, 2100.2, 2100.3 receives a divergent portion of light 2102.1, 2102.2, 2102.3, respectively, from a light source (not shown in FIG. 58). Each divergent portion of light 2102.1, 2102.2, 2102.3 has a center ray 2104.1, 2104.2, 2104.3, respectively.

By tilting field raster elements about individual tilt angles a convergence of the diverging beam is achieved. For example, with respect to a plane 2106, field raster element 2100.1 situated parallel thereto, field raster element 2100.2 is tilted at an angle $\alpha_1$, and field raster element 2100.2 is tilted at an angle $\alpha_2$. Plane 2106, may represent, for example, a field raster element plate on which field raster elements 2100.1, 2100.2, 2100.3 are mounted.

Due to the collecting effect of each field raster element 2100.1, 2100.2, 2100.3, secondary light sources 2106.1, 2106.2, 2106.3 are provided. A set of pupil raster elements 2108.1, 2108.2, 2108.3 are situated at or near the site of secondary light sources 2106.1, 2106.2, 2106.3.

Pupil raster element 2108.1 receives and directs a first bundle of light from field raster element 2100.1. Pupil raster element 2108.2 receives and directs a second bundle of light from field raster element 2100.2. Pupil raster element 2108.1 images field raster element 2100.1 in an image plane (not shown in FIG. 58), and pupil raster element 2108.2 images field raster element 2100.2 in the image plane. Thus, there is a one-to-one correlation between the field raster elements and the pupil raster elements.

Center rays 2104.1, 2104.2, 2104.3 from field raster elements 2100.1, 2100.2 and 2100.3 are received by pupil raster elements 2108.1, 2108.2 and 2108.3, respectively, and redirected so that they intersect in the image plane. This effect is achieved by tilting pupil raster elements 2108.1, 2108.2 and 2108.3 with respect to a plane 2110. For example, in FIG. 58, pupil raster element 2108.3 is shown to be situated parallel to plane 2110, whereas pupil raster elements 2108.1 and 2108.2 are tilted at angles $\beta_1$ and $\beta_2$, respectively, with respect to plane 2110.

It should be understood that various alternatives and modifications of the present invention could be devised by those skilled in the art. The present invention is intended to embrace all such alternatives, modifications and variances that fall within the scope of the appended claims.

What is claimed is:

1. An illumination system for light having wavelengths $\leq 193$ nm, comprising:
   a first field raster element for receiving a first diverging portion of said light and directing a first bundle of said light;
   a second field raster element for receiving a second diverging portion of said light and directing a second bundle of said light, wherein said first field raster element is oriented at an angle with respect to said second field raster element to cause a center ray of said first bundle to intersect with a center ray of said second bundle at an image plane; and
   an optical element for imaging secondary sources of said light in an exit pupil, wherein said optical element is situated in a path of said light after said first and second field raster elements and before said image plane.

2. The illumination system of claim 1, wherein said first field raster element is movable so that said angle can be altered.

3. The illumination system of claim 1, wherein said first and second field raster elements produce said secondary sources of said light.

3. The illumination system of claim 1, wherein said first and second field raster elements have positive optical power.

4. The illumination system of claim 1, wherein said illumination system produces images of said first and second field raster elements that are superimposed, at least partially, in said image plane.

5. The illumination system of claim 1, wherein said first and second field raster elements are rectangular in shape.

6. The illumination system of claim 1, wherein said optical element forms a ring field of said light in said image plane.

7. The illumination system of claim 1, wherein said illumination system further comprises:
   a first pupil raster element for receiving and directing said first bundle from said first field raster element; and
   a second pupil raster element for receiving and directing said second bundle from said second field raster element.

8. The illumination system of claim 7, wherein said first and second pupil raster elements are located at or nearby a site of said secondary sources of said light.

9. The illumination system of claim 7,
   wherein said first pupil raster element images said first field raster element in said image plane, and
   wherein said second pupil raster element images said second field raster element in said image plane.

10. The illumination system of claim 9, wherein said illumination system provides a one-to-one correlation between said first and second field raster elements and said first and second pupil raster elements.

11. The illumination system of claim 1, further comprising a second optical element for providing said first and second diverging portions of said light to said first and second field raster elements.

12. The illumination system of claim 1, wherein said wavelengths are in a range of about 10 nm to 15 nm.

13. A projection exposure apparatus for microlithography, comprising:
   the illumination system of claim 1;
   a first carrier for positioning a mask in said image plane of the illumination system;
   a second carrier for a light sensitive object; and
   a projection objective having an entrance pupil in a same plane as said exit pupil of the illumination system, for imaging said mask onto said light sensitive object.

14. A process for producing microelectronic component, comprising utilizing the projection exposure apparatus of claim 13.

15. An illumination system for light having wavelengths $\leq 193$ nm, comprising:
   a first field raster element for receiving a first diverging portion of said light and directing a first bundle of said light;
   a second field raster element for receiving a second diverging portion of said light and directing a second bundle of said light, wherein said first field raster element is oriented at an angle with respect to said second field raster element to cause a center ray of said first bundle to intersect with a center ray of said second bundle at an image plane; and
   an optical element for imaging secondary sources of said light in an exit pupil, wherein said optical element is situated in a path of said light after said first and second field raster elements and before said image plane,
   wherein said first and second field raster elements are of a rectangular shape, produce said secondary sources of said light, and have positive optical power,
   wherein said illumination system produces images of said first and second field raster elements that are superimposed, at least partially, in said image plane, and
   wherein said optical element forms a ring field of said light in said image plane.

16. The illumination system of claim 15, wherein said illumination system further comprises:
   a first pupil raster element for receiving and directing said first bundle from said first field raster element; and
   a second pupil raster element for receiving and directing said second bundle from said second field raster element.

17. The illumination system of claim 16, wherein said first and second pupil raster elements are located at or nearby a site of said secondary sources of said light.

18. The illumination system of claim 16,
wherein said first pupil raster element images said first field raster element in said image plane, and
wherein said second pupil raster element images said second field raster element in said image plane.

19. The illumination system of claim 18, wherein said illumination system provides a one-to-one correlation between said field raster elements and said pupil raster elements.

20. An illumination system for wavelengths $\leq 193$ nm, particularly for EUV lithography with
a primary light source;
a device for producing secondary light sources,
one or more first optical elements, which are arranged between the device and an image plane of the illumination system,
wherein the first optical elements image the secondary light sources in an exit pupil of the illumination system;
wherein the device for producing secondary light sources comprises a collector unit,
wherein a diverging beam is impinging on the collector unit,
wherein the collector unit comprises one or more second optical elements for collecting the diverging beam,
wherein the second optical element comprises a first mirror or lens which is divided into raster elements
wherein the raster elements are arranged to collect the diverging beam.

21. The illumination system of claim 20, wherein said raster elements are rectangular in shape.

22. The illumination system of claim 20, wherein said first optical elements form a ring field of said light in said image plane.

23. An illumination system for light having wavelengths $\leq 193$ nm, comprising:
a first field raster element for receiving a first diverging portion of said light and directing a first bundle of said light;
a second field raster element for receiving a second diverging portion of said light and directing a second bundle of said light, wherein said first field raster element is oriented at an angle with respect to said second field raster element to cause a center ray of said first bundle to intersect with a center ray of said second bundle at an image plane of said illumination system, and wherein said first and second field raster elements produce secondary sources of said light; and
an optical element for imaging said secondary sources of said light in an exit pupil of said illumination system, wherein said optical element is situated in a path of said light after said first and second field raster elements and before said image plane,
wherein said illumination system produces images of said first and second field raster elements that are superimposed, at least partially, in said image plane.

24. The illumination system of claim 23, wherein said first and second field raster elements are rectangular in shape.

25. The illumination system of claim 23, wherein said optical element forms a ring field of said light in said image plane.

26. The illumination system of claim 23, wherein said optical element comprises a wobbling mirror.

27. The illumination system of claim 26, wherein said wobbling mirror is situated close to said image plane.

28. The illumination system of claim 23, wherein said optical element comprises a mirror with a dynamically deformable mirror surface.

* * * * *